(12) United States Patent
Razavieh et al.

(10) Patent No.: US 11,049,934 B2
(45) Date of Patent: Jun. 29, 2021

(54) TRANSISTOR COMPRISING A MATRIX OF NANOWIRES AND METHODS OF MAKING SUCH A TRANSISTOR

(71) Applicant: GLOBALFOUNDRIES U.S. Inc., Santa Clara, CA (US)

(72) Inventors: Ali Razavieh, Albany, NY (US); Julien Frougier, Albany, NY (US); Bradley Morgenfeld, Greenfield Center, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 82 days.

(21) Appl. No.: 16/574,763

(22) Filed: Sep. 18, 2019

(65) Prior Publication Data

US 2021/0083049 A1 Mar. 18, 2021

(51) Int. Cl.
*H01L 27/12* (2006.01)
*H01L 29/06* (2006.01)
*H01L 29/423* (2006.01)
*H01L 29/08* (2006.01)
*H01L 29/10* (2006.01)
*H01L 29/66* (2006.01)
(Continued)

(52) U.S. Cl.
CPC .... *H01L 29/0673* (2013.01); *H01L 21/02532* (2013.01); *H01L 21/30604* (2013.01); *H01L 21/76224* (2013.01); *H01L 29/0653* (2013.01); *H01L 29/0847* (2013.01); *H01L 29/1033* (2013.01); *H01L 29/42372* (2013.01); *H01L 29/42392* (2013.01); *H01L 29/66545* (2013.01); *H01L 29/66742* (2013.01); *H01L 29/78696* (2013.01); *H01L 21/0217* (2013.01); *H01L 21/31053* (2013.01); *H01L 21/3212* (2013.01)

(58) Field of Classification Search
CPC ............. H01L 29/0673; H01L 29/0653; H01L 29/0847; H01L 29/1033; H01L 29/42372; H01L 29/42392; H01L 29/78696
USPC ......................................................... 257/437
See application file for complete search history.

(56) References Cited

U.S. PATENT DOCUMENTS 6,545,316 B1 4/2003 Baliga
6,992,319 B2 1/2006 Fahimulla et al.
(Continued)

OTHER PUBLICATIONS

Razavieh et al., "A New Method to Achieve RF Linearity in SOI Nanowire MOSFETs," IEEE RFIC Symposium, pp. 167-170. Baltimore, MD, Jun. 2011.
(Continued)

*Primary Examiner* — Long K Tran
(74) *Attorney, Agent, or Firm* — Francois Pagette; Hoffman Warnick LLC

(57) ABSTRACT

One illustrative transistor device disclosed herein includes a nanowire matrix comprising a plurality of nanowire structures that are arranged in at least one substantially horizontally oriented row and at least two substantially vertically oriented columns, the at least two substantially vertically oriented columns being laterally spaced apart from one another in a gate width direction of the transistor device, each of the plurality of nanowire structures comprising an outer perimeter. This illustrative embodiment of the transistor device further includes a gate structure that is positioned around the outer perimeter of all of the nanowire structures in the matrix, and a gate cap positioned above the gate structure.

15 Claims, 27 Drawing Sheets

(51) Int. Cl.
    *H01L 21/02*     (2006.01)
    *H01L 21/306*     (2006.01)
    *H01L 21/762*     (2006.01)
    *H01L 29/786*     (2006.01)
    *H01L 21/321*     (2006.01)
    *H01L 21/3105*     (2006.01)

(56) References Cited

U.S. PATENT DOCUMENTS

| | | |
|---|---|---|
| 9,087,899 B2 | 7/2015 | Brindle et al. |
| 9,892,912 B2 | 2/2018 | Yin et al. |
| 10,236,362 B2 | 3/2019 | Seo |
| 2018/0197992 A1* | 7/2018 | Cheng ................. H01L 29/0847 |
| 2020/0227105 A1* | 7/2020 | Gosavi ................... H01L 43/08 |
| 2020/0303502 A1* | 9/2020 | Bomberger ....... H01L 29/66545 |
| 2020/0357911 A1* | 11/2020 | Frougier ............... H01L 29/165 |
| 2020/0373300 A1* | 11/2020 | Zhang ............... H01L 21/02603 |

OTHER PUBLICATIONS

Razavieh et al., "Utilizing the Unique Properties of Nanowire MOSFETs for RF Applications," Nano Letters, 13(4), pp. 1549-1554, Apr. 2013.

Razavieh et al, "Transconductance Linearity Analysis of 1-D, Nanowire FETs in the Quantum Capacitance Limit," IEEE Transactions on Electron Devices, vol. 60, No. 6, pp. 2071-2076, Jun. 2013.

Zheng et al., Simulation-Based Study of the Inserted-Oxide FinFET for Future Low-Power System-on-Chip Applications, IEEE Edl, vol. 36, No. 8, Aug. 2015 (i-FinFET paper).

Zheng et al., "FinFET Evolution Toward Stacked-Nanowire FET for CMOS Technology Scaling," IEEE TED, vol. 62, No. 12, Dec. 2015 (i-FinFET paper).

\* cited by examiner

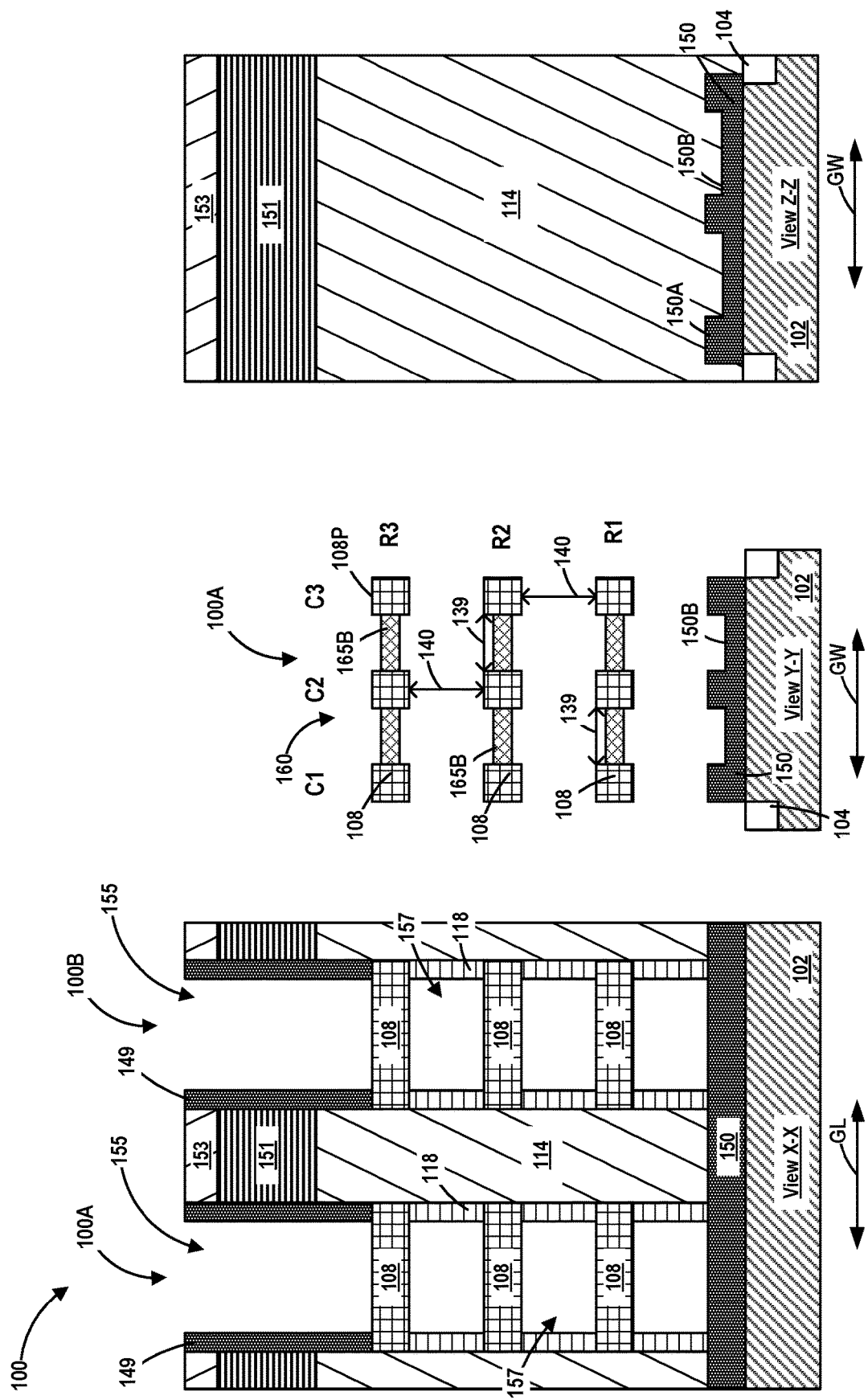

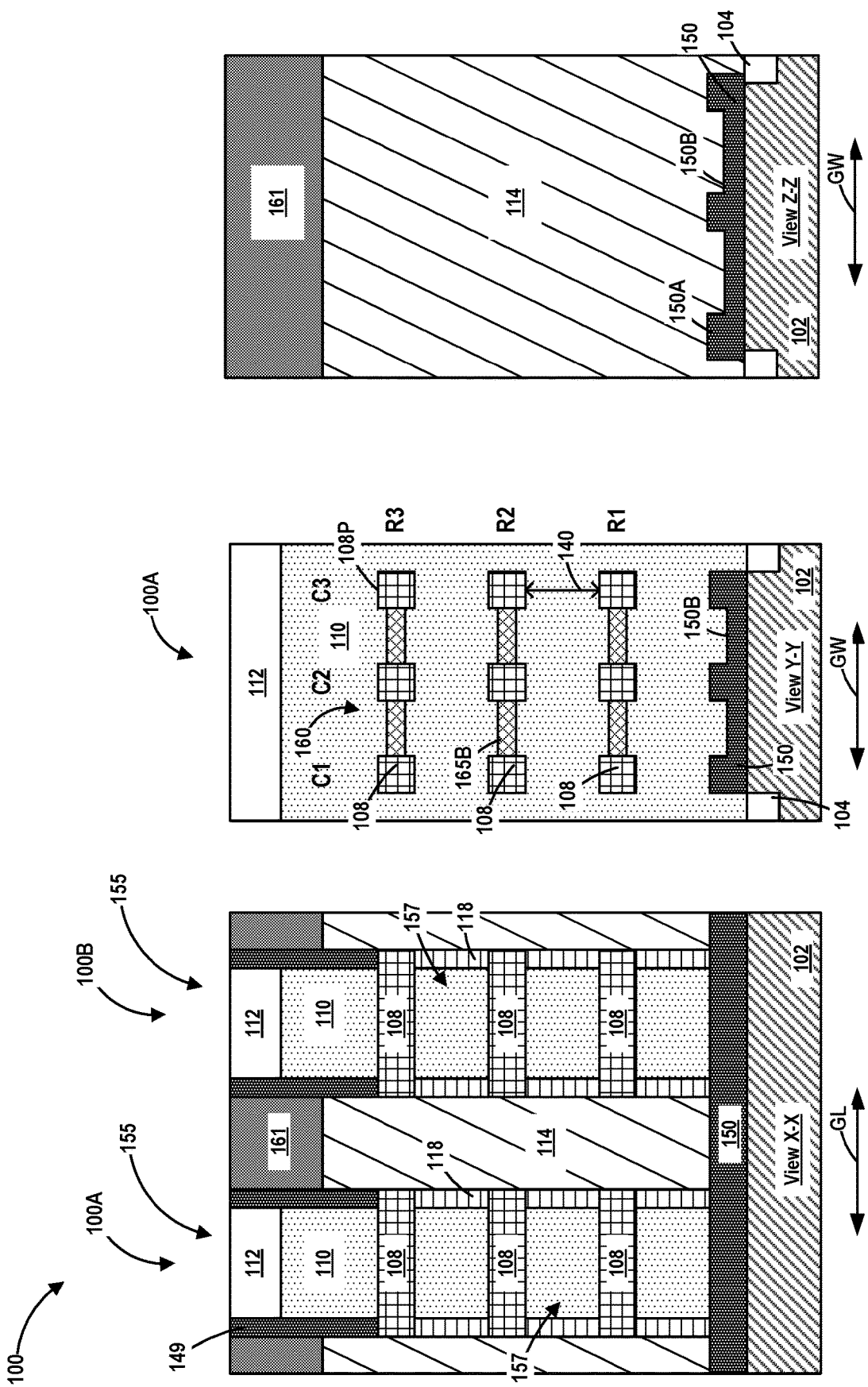

TRANSISTOR COMPRISING A MATRIX OF NANOWIRES AND METHODS OF MAKING SUCH A TRANSISTOR

BACKGROUND

Field of the Invention

The present disclosure generally relates to various novel embodiments of a transistor that comprises a matrix of nanowires and various novel methods of making such a transistor.

Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either N-type (NFET) or P-type (PFET) devices, wherein the "N" and "P" designation is based upon the type of dopants used to create the source/drain regions of the devices. So-called CMOS (Complementary Metal Oxide Semiconductor) technology or products refers to integrated circuit products that are manufactured using both NFET and PFET transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the drain region and the source region and current flows from the source region to the drain region of the transistor.

Transistors come in a variety of shapes and configuration, e.g., planar devices, FinFET devices, gate-all-around (GAA) devices, such as nanowire devices, etc. Device designers are under constant pressure to produce transistor devices that exhibit reduced size, increased performance levels and that meet the sometimes imposing demands of various applications. For example, for transistors employed in high frequency RF applications, RF linearity is an important characteristic of transistor devices used in such RF applications.

The present disclosure is generally directed to various novel embodiments of a transistor that comprises a matrix of nanowires and various novel methods of making such a transistor that may solve or at least reduce one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is directed to various novel embodiments of a transistor that comprises a matrix of nanowires and various novel methods of making such a transistor. One illustrative transistor device disclosed herein includes a nanowire matrix comprising a plurality of nanowire structures that are arranged in at least one substantially horizontally oriented row and at least two substantially vertically oriented columns, the at least two substantially vertically oriented columns being laterally spaced apart from one another in a gate width direction of the transistor device, each of the plurality of nanowire structures comprising an outer perimeter. This illustrative embodiment of the transistor device further includes a gate structure that is positioned around the outer perimeter of all of the nanowire structures in the matrix, and a gate cap positioned above the gate structure.

Another illustrative transistor device disclosed herein includes a nanowire matrix comprising a plurality of nanowire structures that are arranged in a plurality of horizontally oriented rows and a plurality of substantially vertically oriented columns, wherein the plurality of substantially horizontally oriented rows are vertically spaced apart from one another, the plurality of vertically oriented columns are laterally spaced apart from one another in a gate width direction of the transistor device and wherein each of the plurality of nanowire structures comprises an outer perimeter. In this illustrative example, the transistor device further includes a gate structure that is positioned around the outer perimeter of all of the nanowire structures in the matrix, a gate cap positioned above the gate structure and regions of epitaxial semiconductor material positioned in the source and drain regions of the transistor device, wherein the regions of epitaxial semiconductor material conductively contact the plurality of nanowire structures in the nanowire matrix.

Yet another illustrative embodiment of a transistor device disclosed herein includes a nanowire matrix comprising a plurality of nanowire structures that are arranged in a plurality of horizontally oriented rows and a plurality of substantially vertically oriented columns, wherein the plurality of substantially horizontally oriented rows are vertically spaced apart from one another, the plurality of vertically oriented columns are laterally spaced apart from one another in a gate width direction of the transistor device and wherein each of the plurality of nanowire structures comprises an outer perimeter. In this illustrative example, the transistor device further includes an insulating material positioned between and engaging the nanowire structures in each of the plurality of horizontally oriented rows of nanowire structures, a gate structure that is positioned around the outer perimeter of all of the nanowire structures in the matrix, a gate cap positioned above the gate structure and regions of epitaxial semiconductor material positioned in the source and drain regions of the transistor device, wherein the regions of epitaxial semiconductor material conductively contact the plurality of nanowire structures in the nanowire matrix.

BRIEF DESCRIPTION OF THE DRAWINGS

The disclosure may be understood by reference to the following description taken in conjunction with the accompanying drawings, in which like reference numerals identify like elements, and in which:

FIGS. 24-27 depict yet another illustrative embodiment of a transistor disclosed herein that includes a matrix of nanowires and various novel methods of making such a transistor.

Figure 1:
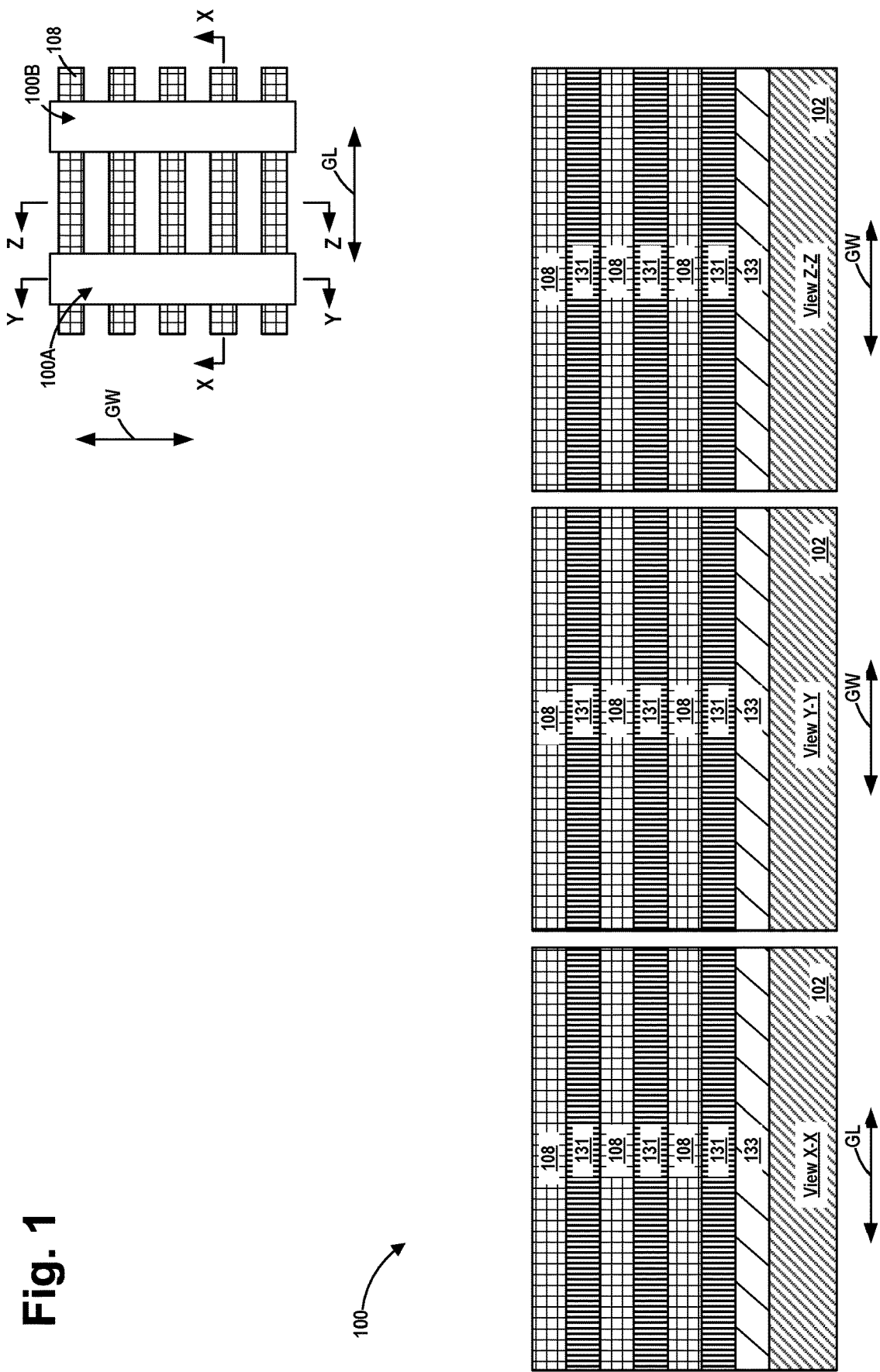
FIGS. 1-17 depict one illustrative embodiment of a transistor disclosed herein that includes a matrix of nanowires and various novel methods of making such a transistor.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail.

FIGS. 1-17 depict one illustrative embodiment of a nanowire transistor device 100 disclosed herein that includes a matrix 160 of nanowire structures 108 and various novel methods of making such a transistor. In the illustrative examples depicted herein, two illustrative nanowire transistor devices 100A, 100B (collectively referenced using the numeral 100) will be formed above a semiconductor substrate 102. Various cross-sectional views of the transistor devices 100 (views "X-X", "Y-Y" and "Z-Z") depicted in the attached drawings are taken where indicated in the simplistic plan view in FIG. 1. More specifically, the cross-sectional view X-X is taken through the axial length of the nanowire structures 108 in the gate length (GL—current transport) direction of the transistors 100. The cross-sectional view Y-Y is taken through the gate structure of the transistor device 100A in the gate width (GW) direction of the transistor 100A, i.e., transverse to the long axis of the nanowire structures 108. The view Z-Z is a cross-sectional view taken through a source/drain region of the transistors 100 in the gate-width direction of the transistor devices. The plan view in the drawings does not reflect the processing shown in the cross-sectional views of the drawings and the drawings are not to scale.

As noted above, in the examples depicted herein, the nanowire transistor devices 100 will be formed on and above a semiconductor substrate 102. The substrate 102 may have a variety of configurations, such as a simple bulk configuration. The substrate 102 may be made of silicon or it may be made of semiconductor materials other than silicon. Thus, the terms "substrate" or "semiconductor substrate" should be understood to cover all semiconducting materials and all forms of such substrates. The various components, structures and layers of material depicted herein may be comprised of a variety of different materials and they may be formed by performing a variety of known process operations, e.g., chemical vapor deposition (CVD), atomic layer deposition (ALD), a thermal growth process, spin-coating techniques, masking, etching, etc. The thicknesses of these various layers of material may also vary depending upon the particular application.

As will be appreciated by those skilled in the art after a complete reading of the present application, the nanowire transistor devices 100 disclosed herein may be an N-type device or a P-type device. Additionally, the gate structure of the nanowire transistor devices 100 may be manufactured using known gate-first or known replacement gate manufacturing techniques. For purposes of disclosure only, the nanowire transistor devices 100 described below will be depicted as being formed above a bulk semiconductor substrate 102 wherein the gate structure of the nanowire transistor devices 100 is formed by performing known replacement gate manufacturing techniques. However, as noted above, the various inventions disclosed herein should not be considered to be limited to the particular examples shown in the attached drawings and described below.

FIG. 1 depicts the nanowire transistor devices 100 at a point in fabrication wherein several process operations have been performed. First, a first epitaxial growth process was performed to form a layer of a first sacrificial semiconductor material 133 on the substrate 102. Next, another epitaxial growth process was performed to form a layer of a second sacrificial semiconductor material 131 on the layer of the first sacrificial semiconductor material 133. Then, a third epitaxial growth process was performed to form a layer of a nanowire semiconductor material 108 on the second sacrificial semiconductor material 131. Thereafter, additional epitaxial growth processes were performed to form additional layers of the second sacrificial semiconductor material 131 and additional layers of the nanowire semiconductor material 108 as shown in the drawings. In the depicted example, three of the layers of the second sacrificial semiconductor material 131 and three of the layers of nanowire semiconductor material 108 were formed. However, as will be appreciated by those skilled in the art after a complete reading of the present application, the number of the layers of material 131 and 108 may vary, e.g., in some cases, only a single layer of the second sacrificial semiconductor material 131 and only a single layer of the nanowire semiconductor material 108 may be formed, while in other cases more than three of the layers 131, 108 may be formed. As will be described more fully below, the nanowire structures 108 for the nanowire transistor devices 100 will be fabricated from the layers of nanowire semiconductor material 108.

The vertical thickness of the various layers of semiconductor material 133, 131, 108, as well as the materials used for the layers of semiconductor material 133, 131, 108, may vary depending upon the particular application. In some applications, all of the layers of the second sacrificial semiconductor material 131 may have the same thickness and be made of the same semiconductor material, but that may not be the case in all applications. Similarly, in some applications, all of the layers of the nanowire semiconductor material 108 may have the same thickness and be made of the same semiconductor material, but that may not be the case in all applications. For example, in some applications, the uppermost layer of the nanowire semiconductor material 108 shown in the drawings may have a greater vertical thickness than that of the other layers of nanowire semiconductor material 108 shown in the drawings. Additionally, the layers of the second sacrificial semiconductor material 131 and the layers of the nanowire semiconductor material 108 need not have the same thickness, but that may be the case in some applications.

In general, the materials for the layers of semiconductor material 133, 131, 108 should be selected such that there is an effective degree of etch selectivity between and among the various layers of semiconductor material 133, 131, 108 and the substrate 102. In general, the first sacrificial semiconductor material 133 should be made of a material that may be selectively removed (by etching) relative to the substrate 102, the layers of the second sacrificial semiconductor material 131 and the layers of the nanowire semiconductor material 108. Similarly, the second sacrificial semiconductor material 131 should be made of a material that may be selectively removed (by etching) relative to the substrate 102 and the layers of the nanowire semiconductor material 108. In one illustrative embodiment, the substrate 102 may be comprised of silicon, the first sacrificial semiconductor material 133 may be comprised of silicon germanium ($SiGe_{60}$), the second sacrificial semiconductor material 131 may also be comprised of silicon germanium, but with a lower concentration of germanium than the amount of germanium that is present in the first sacrificial semiconductor material 133, e.g., the second sacrificial semiconductor material 131 may be comprised of $SiGe_{25}$, and the nanowire semiconductor material 108 may be comprised of silicon. Of course, as will be appreciated by those skilled in the art after a complete reading of the present application, there are many other possible combinations of materials that may be used for the substrate 102 and the layers of semiconductor material 133, 131, 108.

Figure 2:
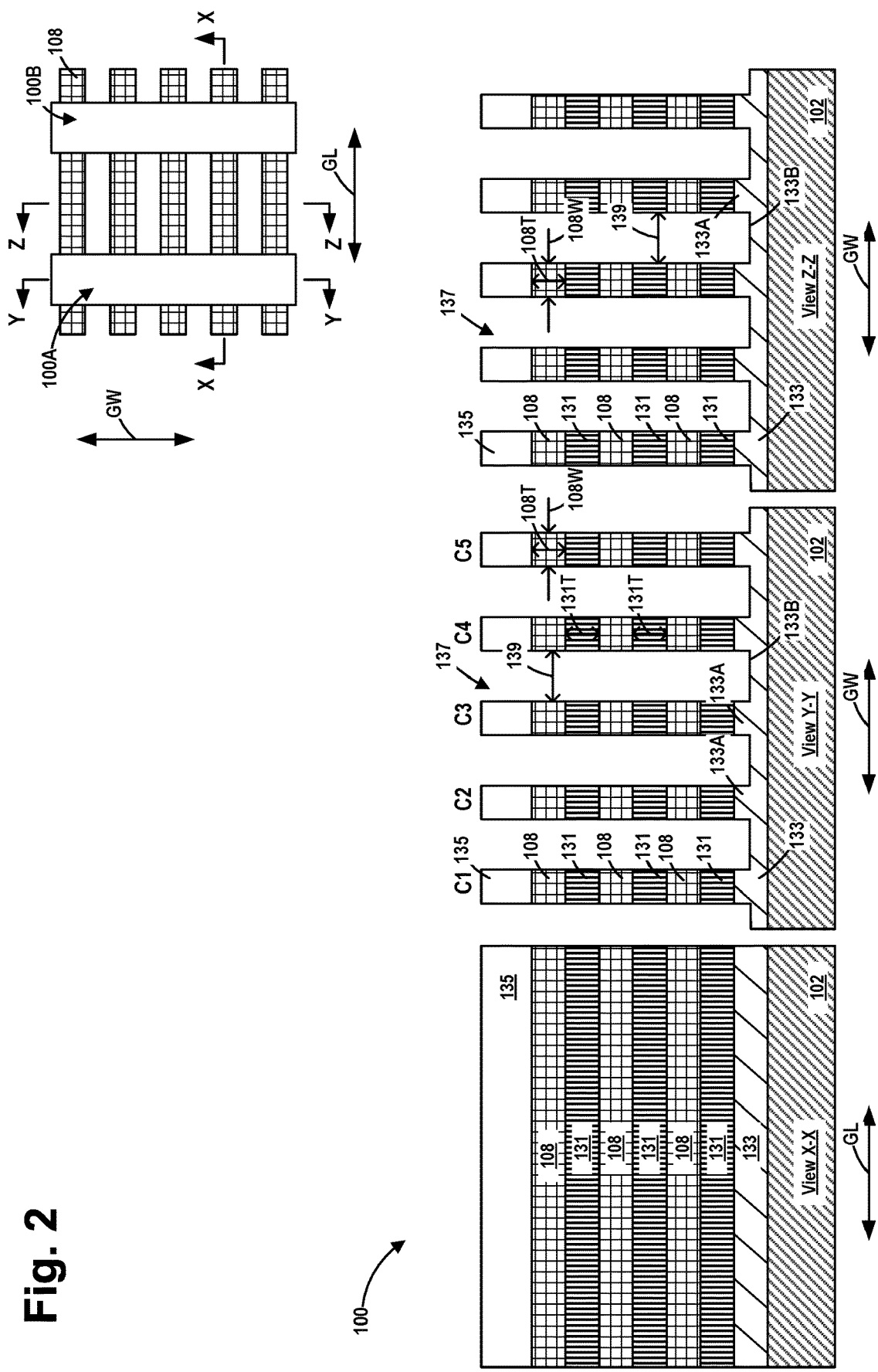

FIG. 2 depicts the device 100 after several process operations were performed. First, a patterned etch mask 135 was formed above the product. In one illustrative example, the patterned etch mask 135 may be a patterned layer of photoresist or OPL. In other applications, the patterned etch mask 135 may be a patterned hard mask layer that is comprised of, for example, silicon nitride. Such a patterned hard mask layer may be formed by performing known deposition, masking and etching techniques. Next, one or more etching processes, e.g., anisotropic etching processes, were performed through the patterned etch mask 135 to successively remove exposed portions of the layers of the nanowire semiconductor material 108 and the layers of the second sacrificial semiconductor material 131. Performing these process operations results in the formation of five columns (C1-C5) of the stacked layers of semiconductor materials 131, 108. A lateral space 137 is located between adjacent columns of the stacked layers of semiconductor materials 131, 108. Note that, when removing the bottom-most layer of the second sacrificial semiconductor material 131, some of the first sacrificial semiconductor material 133 is also removed or consumed. As a result, the first sacrificial semiconductor material 133 now comprises a plurality or ridges 133A and a plurality of recesses 133B, with a recess 133B being positioned between adjacent ridges 133A. The height of the ridges 133A and/or the depth of the recesses 133B may vary depending upon the particular application. In the depicted example, the five columns (C1-C5) of semiconductor materials have a substantial uniform spacing 139 between them (in the gate width direction). However, is some applications, the spacing 139 between adjacent columns of the semiconductor materials need not be uniform, but that may be the case in some applications. In the depicted example, the vertical thickness 108T of the layers of the nanowire semiconductor material 108 and the thickness 131T of the layers of second sacrificial semiconductor material 131 may be substantially the same, but as noted above, that may not be the case in all applications. Additionally, in the depicted example, the remaining portions of the nanowire semiconductor material 108 and the second sacrificial semiconductor material 131 have a lateral width 108W (in the gate width direction) that is substantially the same.

Figure 3:
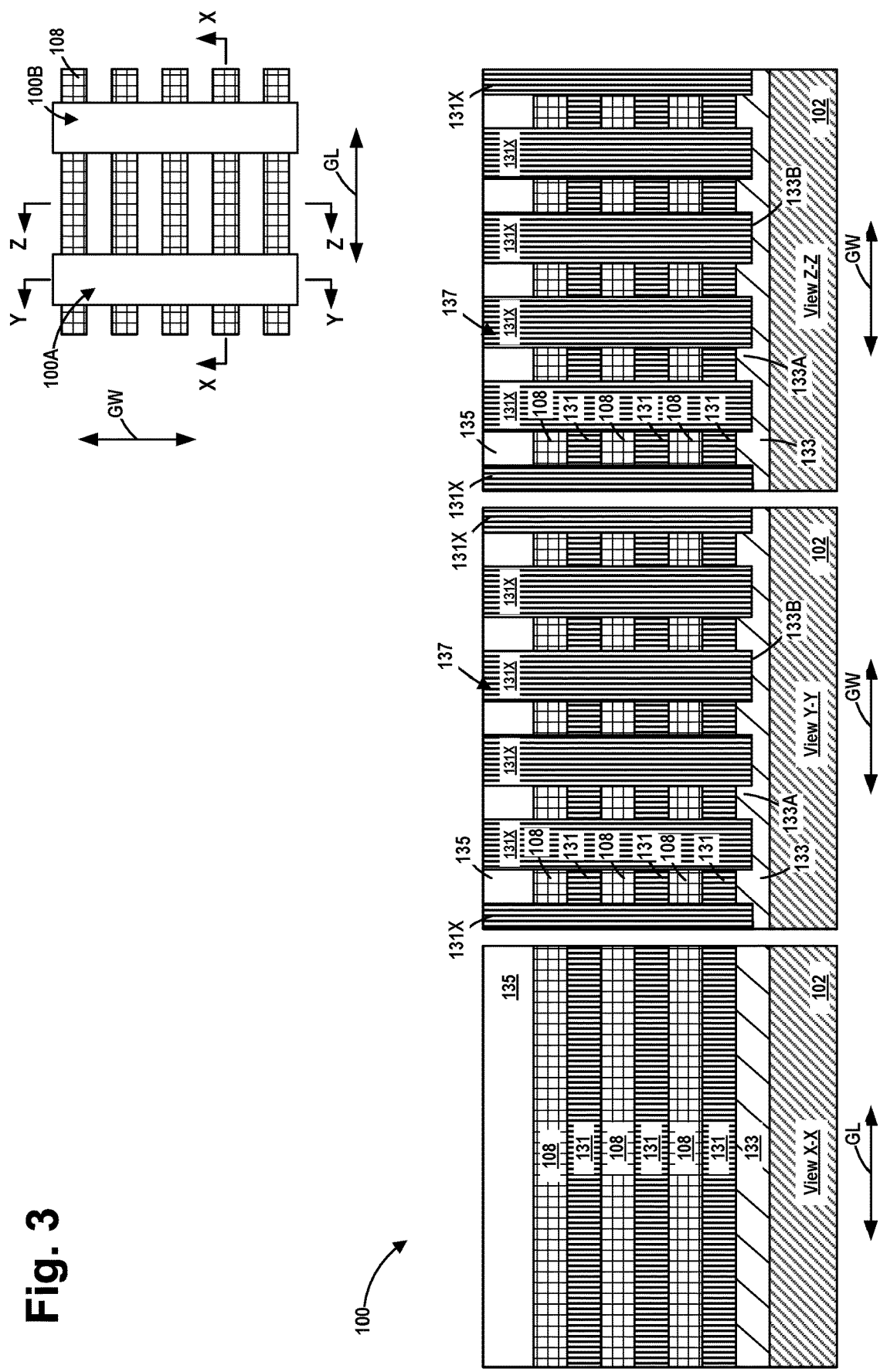

FIG. 3 depicts the nanowire transistor devices 100 after several process operations were performed. First, additional amounts of the second sacrificial semiconductor material—labeled 131X for reference purposes—were formed in the spaces 137 between the five columns (C1-C5) of stacked semiconductor materials. Thereafter, a planarization process, e.g., a chemical mechanical planarization (CMP) process or an etch-back process, was performed to planarize the upper surface of the additional second sacrificial semiconductor material 131X with the upper surface of the patterned etch mask 135.

Figure 4:
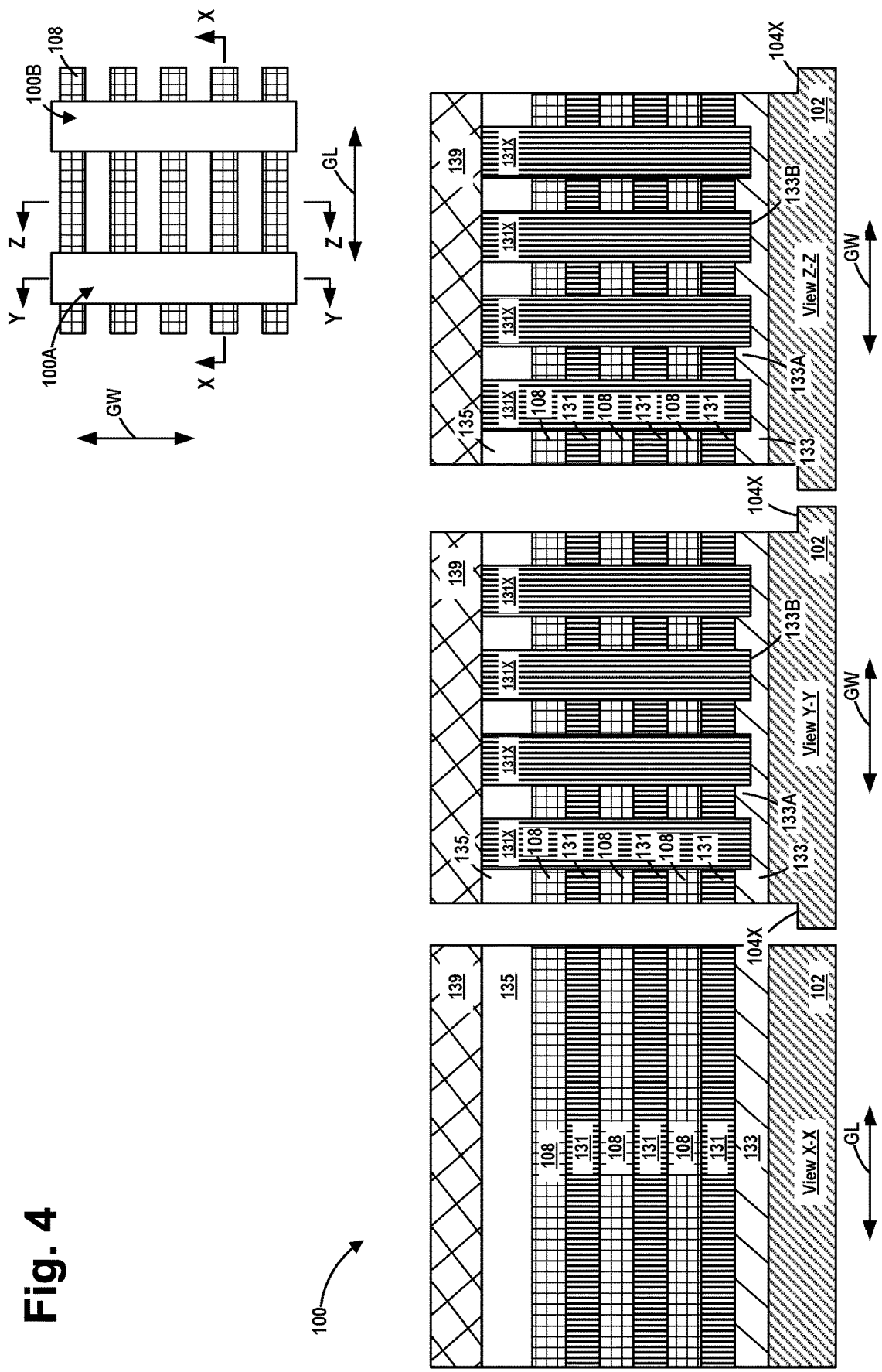

FIG. 4 depicts the nanowire transistor devices 100 after several process operations were performed. First, another patterned etch mask 139 was formed above the product. In one illustrative example, the patterned etch mask 139 may be a patterned layer of photoresist or OPL. The patterned etch mask 139 covers the portions of the various materials where the active nanowire transistor devices 100 will be formed. Thereafter, one or more etching processes were performed through the patterned etch mask 139 so as to remove the underlying materials exposed by the patterned etch mask 139 and to form an isolation trench 104X in the substrate 102 (see views Y-Y and Z-Z).

Figure 5:
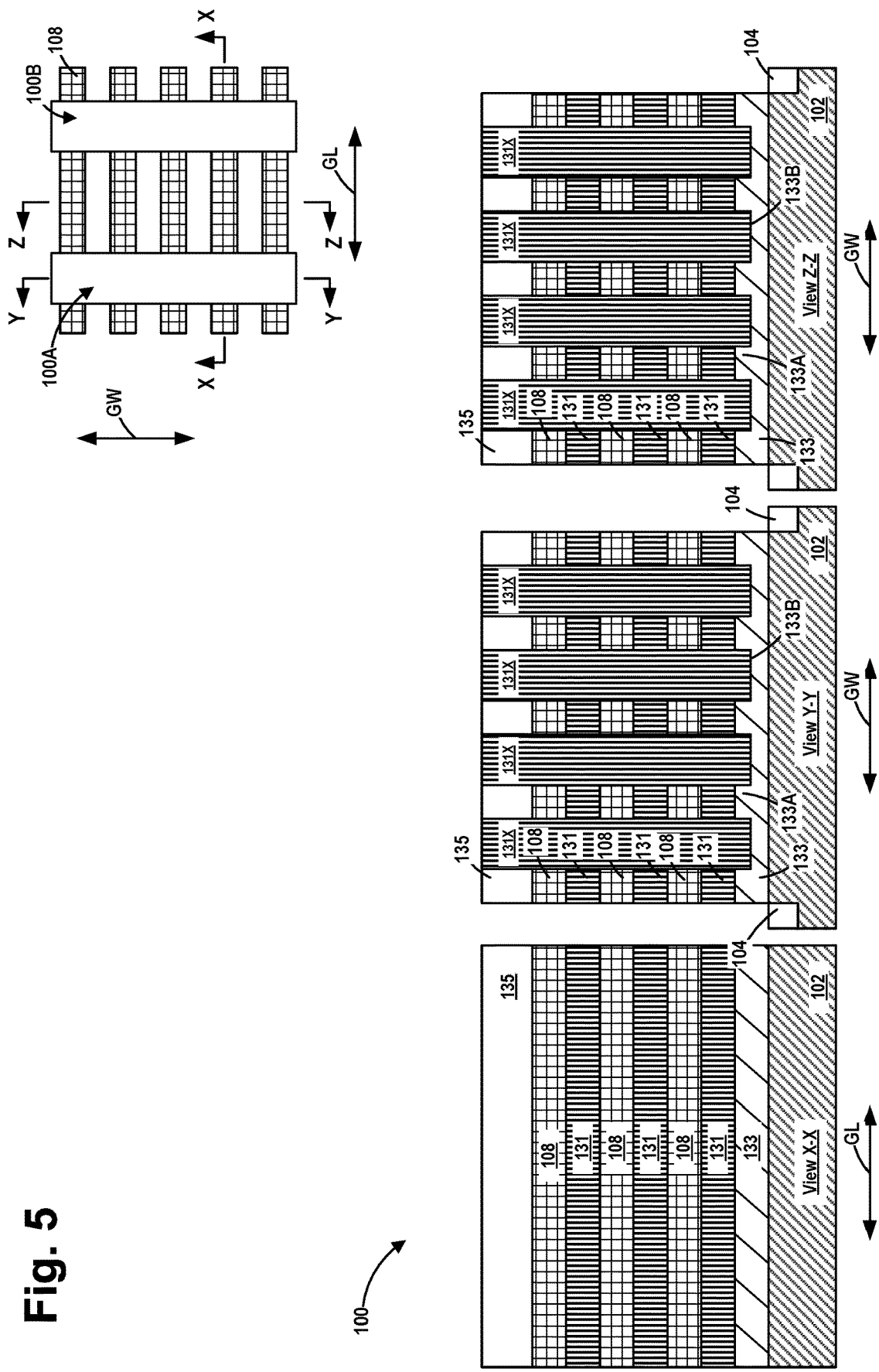

FIG. 5 depicts the nanowire transistor devices 100 after several process operations were performed. First, the patterned etch mask 139 was removed. Then, an isolation structure 104 was formed in the isolation trench 104X. The isolation structure 104 may be comprised of a variety of materials, e.g., silicon dioxide, and it may be formed by performing known manufacturing techniques.

Figure 6:
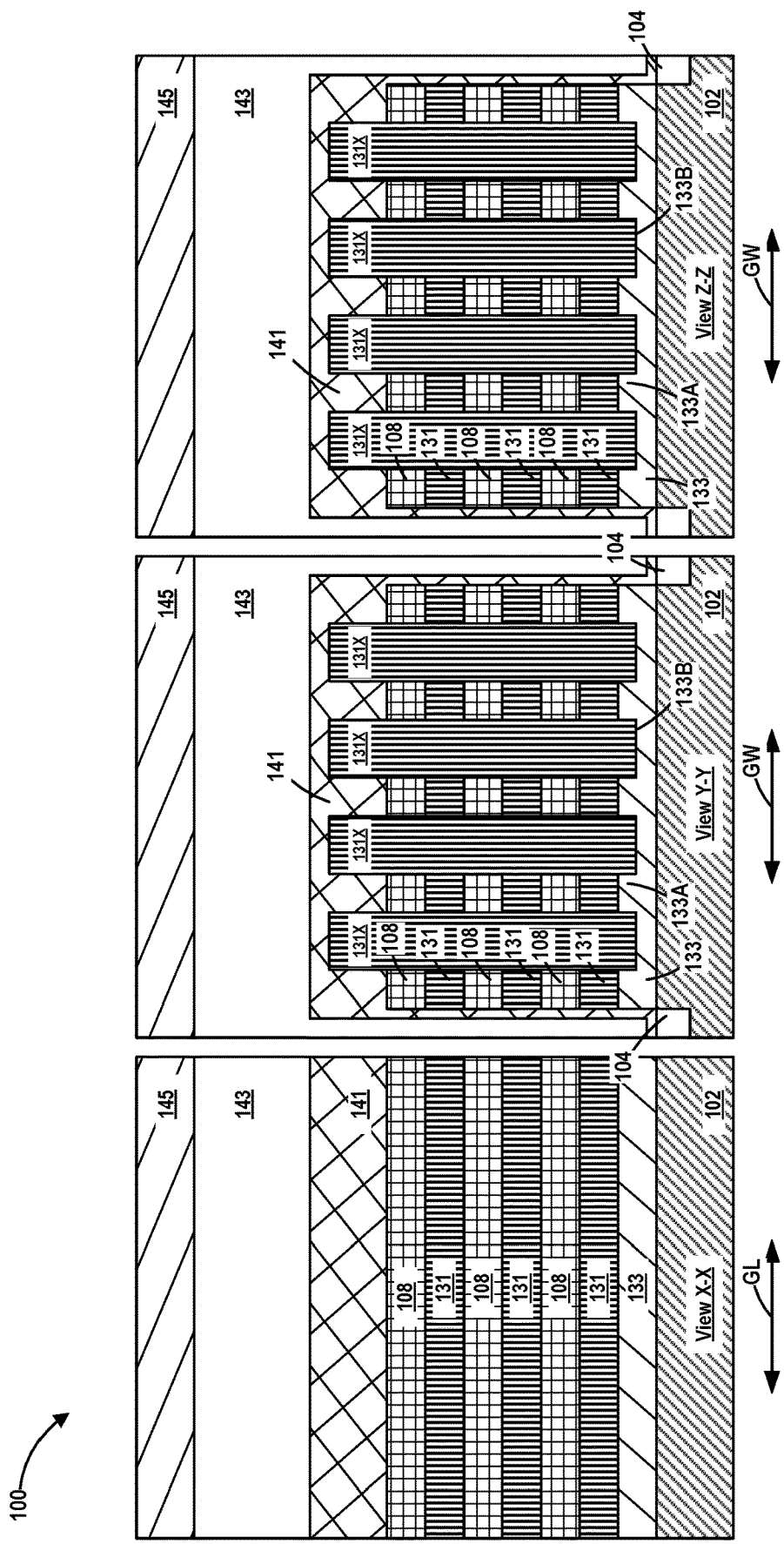

In one illustrative process flow, the next major process operation involves the formation of a gate structure for the nanowire transistor devices 100. By way of illustration only, the final gate structures for the nanowire transistor devices 100 will be depicted as being formed using a replacement gate process. Accordingly, FIG. 6 depicts the product after a layer of sacrificial gate insulation material 141, a layer of sacrificial gate electrode material 143, and a layer of gate cap material 145 were formed on the product. In one embodiment, the layer of sacrificial gate insulation material 141 may be a thermally grown or deposited layer of silicon dioxide, the layer of sacrificial gate electrode material 143 may be made of a material such as polysilicon or amorphous silicon, while the layer of gate cap material 145 may be made of a material such as silicon nitride. The thickness of these materials may vary depending upon the particular application.

Figure 7:
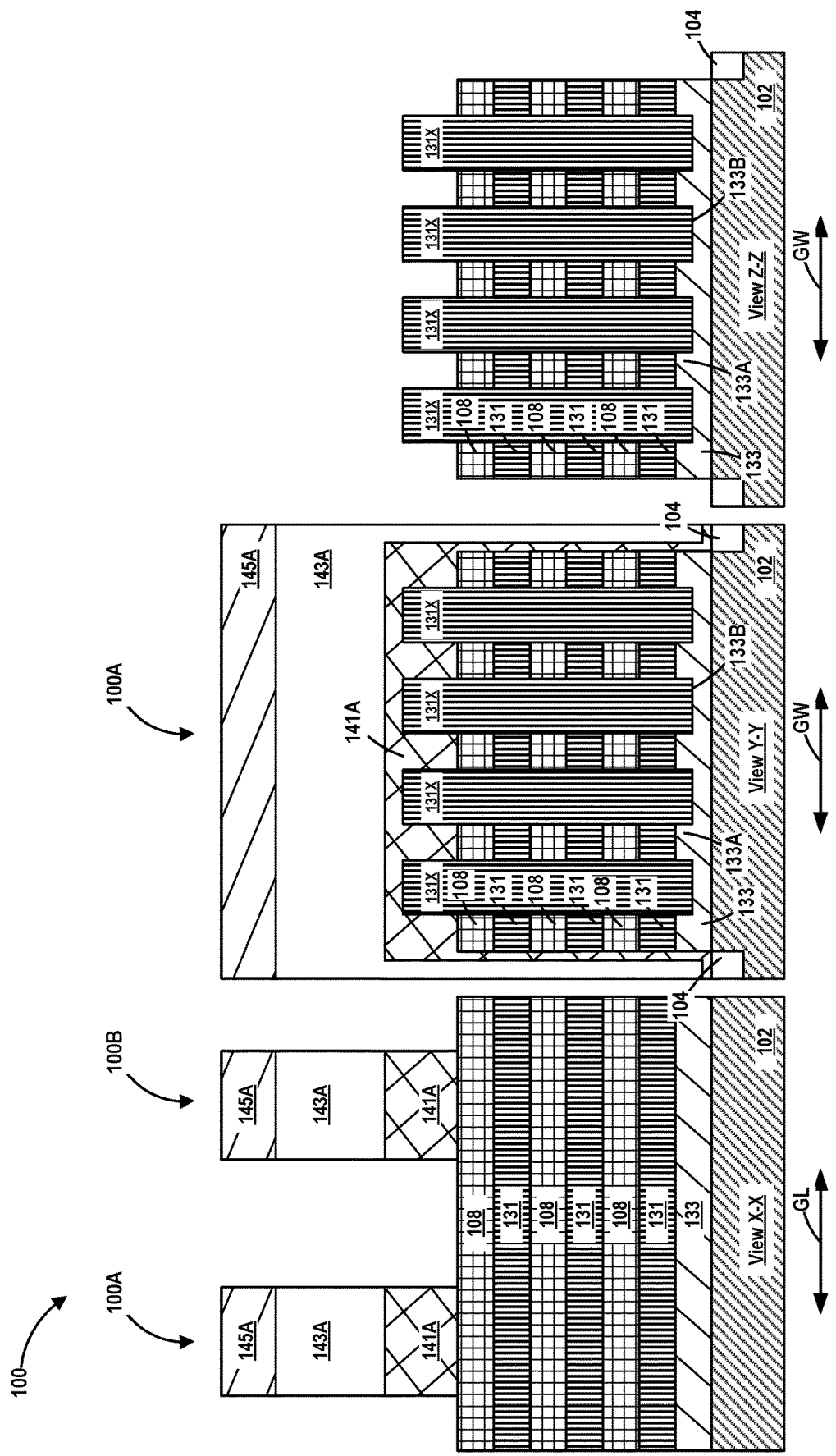

FIG. 7 depicts the nanowire transistor devices 100 after the layer of gate cap material 145, the layer of sacrificial gate electrode material 143 and the layer of sacrificial gate insulation material 141 were patterned by performing traditional masking and etching techniques. Each of the nanowire transistor devices 100 comprises a sacrificial gate structure that consists of a sacrificial gate insulation layer 141A and a sacrificial gate electrode 143A. As depicted, a gate cap 145A is positioned above each of the sacrificial gate structures.

Figure 8:
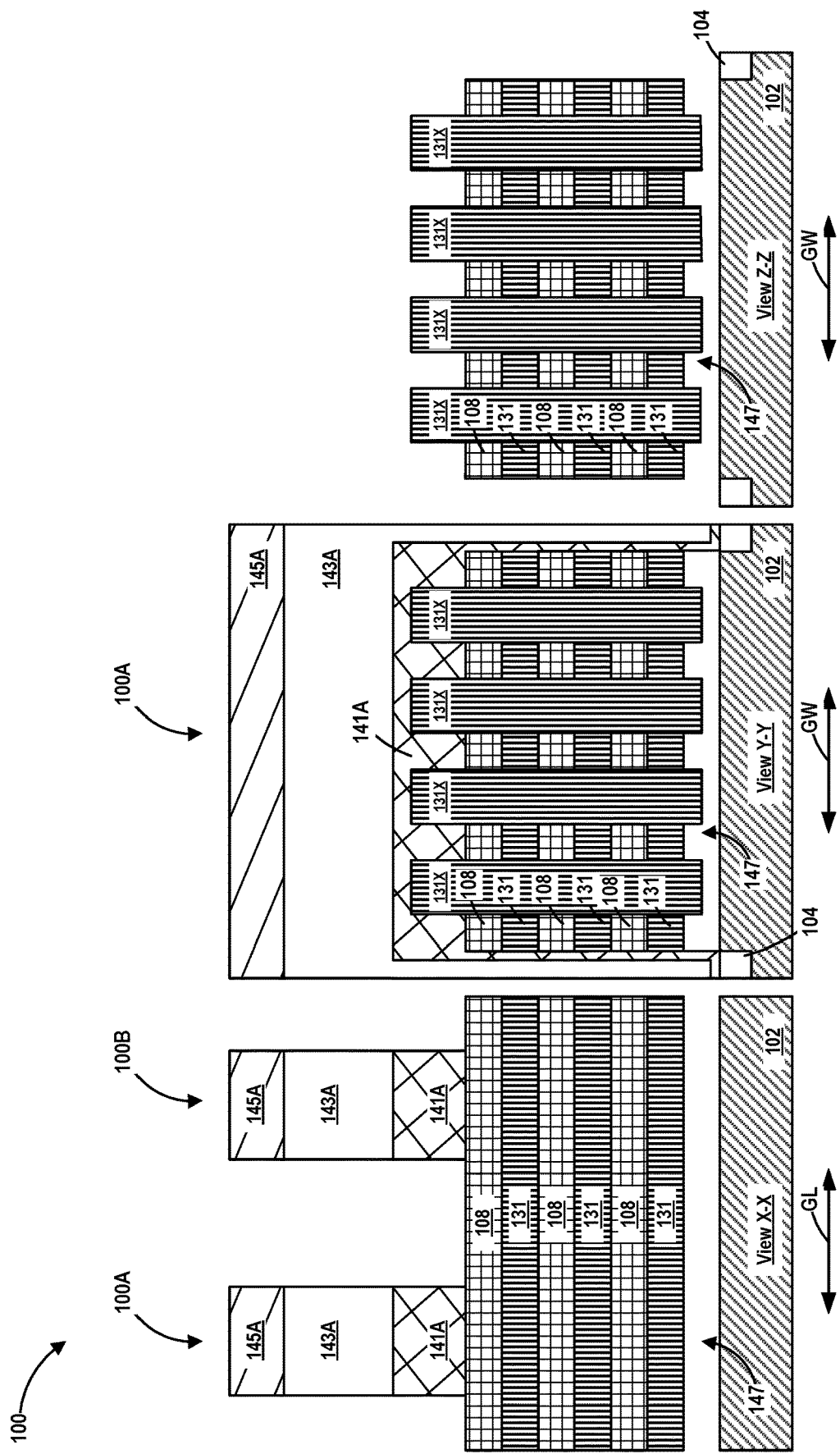

FIG. 8 depicts the nanowire transistor devices 100 after an isotropic etching process was performed to selectively remove the first sacrificial semiconductor material 133 relative to the surrounding materials. This results in the formation of an isolation cavity 147 under the various semiconductor materials 131, 131X and 108.

Figure 9:
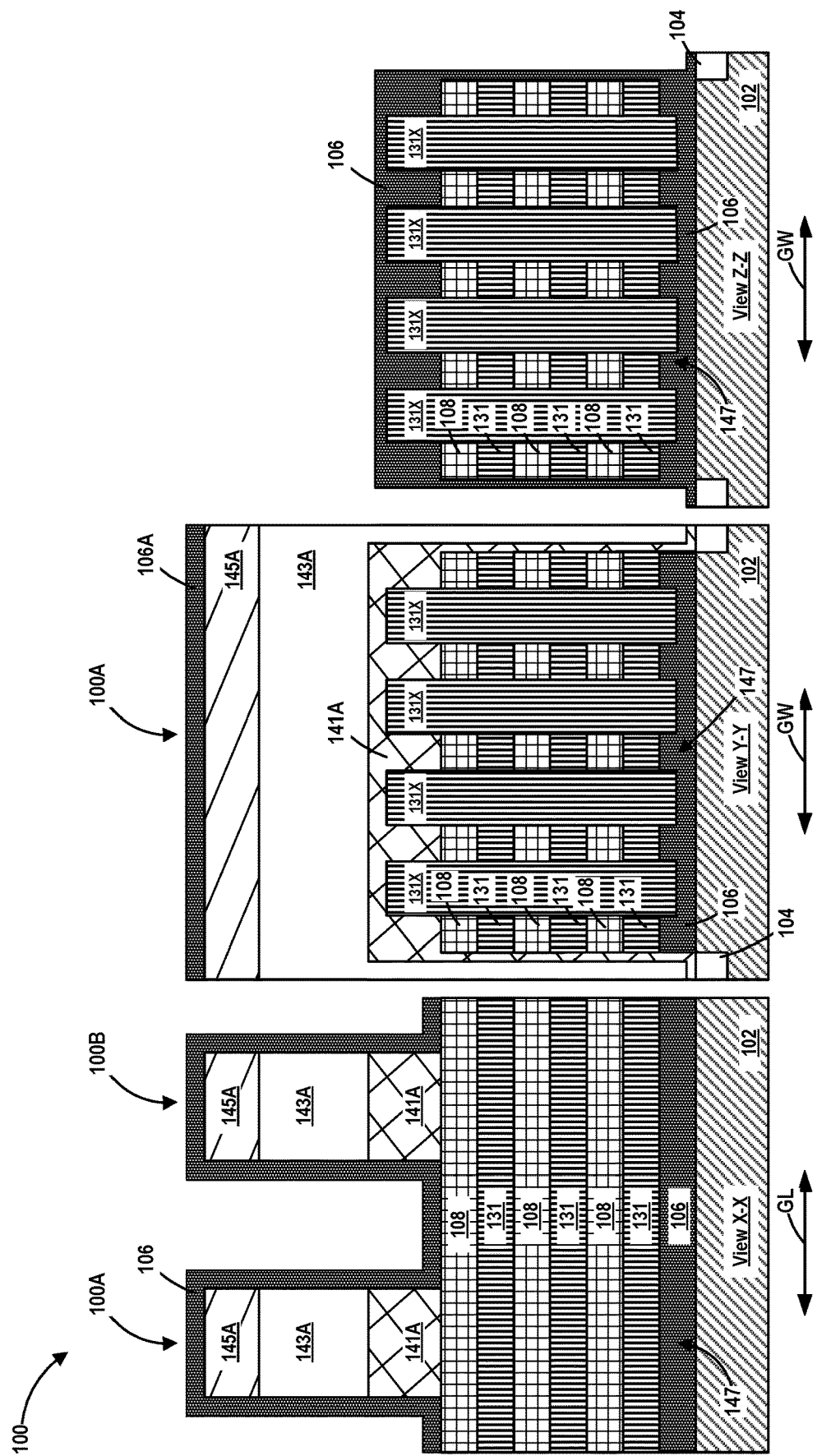

FIG. 9 depicts the devices after a conformal deposition process was performed to form a layer of insulating material (e.g., SiOCN, silicon nitride, a low-k material, etc.) 106 on the product. This layer of insulating material 106 over-fills the isolation cavity 147. The thickness of the layer of insulating material 106 may vary depending upon the particular application.

Figure 10:
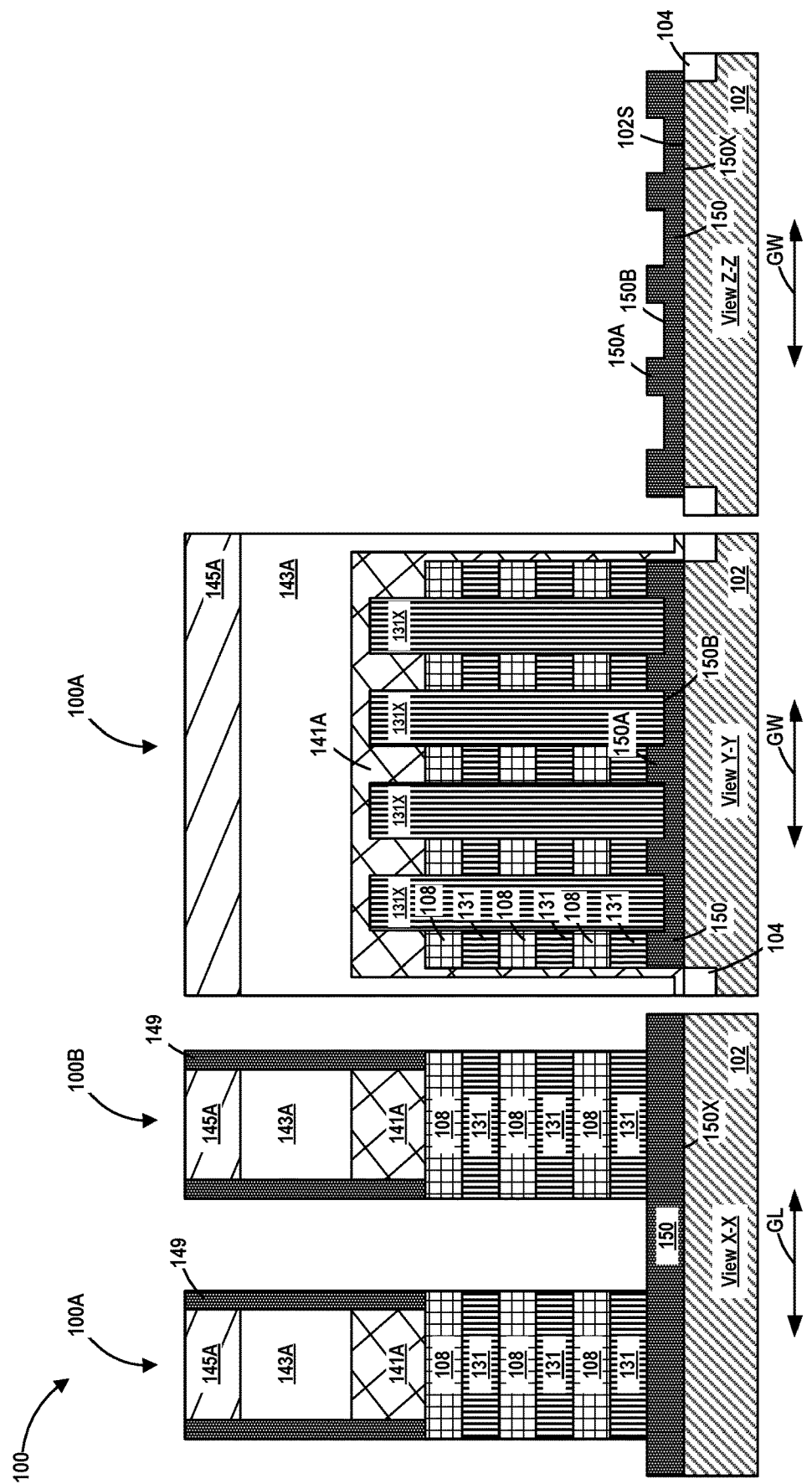

FIG. 10 depicts the nanowire transistor devices 100 after several process operations were performed. First, an anisotropic etching process was performed on the layer of insulating material 106 so as to form a simplistically depicted sidewall spacer 149 adjacent the sacrificial gate structure of each of the nanowire transistor devices 100. The sidewall spacer 149 may be of any desired thickness (as measured at its base). Of course, in some embodiments, more than one sidewall spacer may be formed adjacent the sidewalls of the sacrificial gate structures. The etching process also results in the formation of a lower isolation structure 150 in the isolation cavity 147. The lower isolation structure 150 is comprised of the material of the layer of insulating material 106.

Note that the lower isolation structure 150 comprises an upper surface that includes a plurality of ridges 150A and a plurality of recesses 150B, with a recess 150B being positioned between laterally adjacent ridges 150A. The height and width of the ridges 150A and the depth and width of the recesses 150B may vary depending upon the particular application. As depicted, the lower isolation structure 150 essentially conforms to the configuration of the isolation cavity 147. Note that the ridges 150A and recesses 150B extend in the gate length direction of the devices 100. In one illustrative embodiment, the substantially planar bottom surface 150X of the lower isolation structure 150 is positioned on and in physical contact with an upper surface 102S of the substrate 102.

With continuing reference to FIG. 10, after the formation of the sidewall spacers 149 and the lower isolation structures 150, one or more anisotropic etching processes were performed to remove the exposed portions of the layers of nanowire semiconductor material 108, the layers of the second sacrificial semiconductor material 131 and the additional second sacrificial semiconductor materials 131X.

Figure 11:
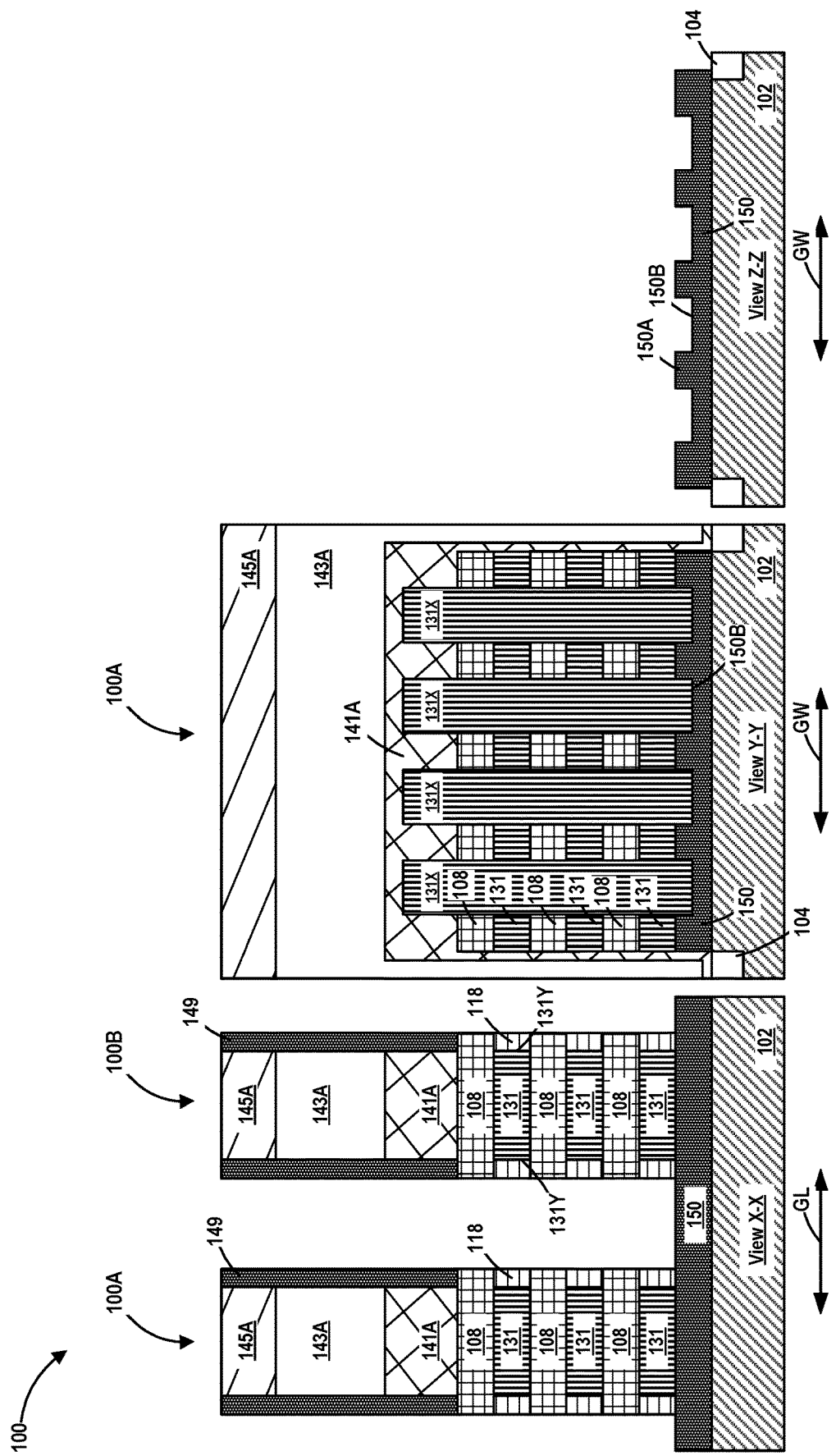

FIG. 11 depicts the nanowire transistor devices 100 after several process operations were performed. First, an isotropic etching process was performed to selectively remove portions of the lateral ends of the layers of the second semiconductor material 131, such that the layers of the second semiconductor material 131 have recessed end surfaces 131Y. The recessed end surface 131Y partially defines an inner spacer cavity that is adapted to receive an inner spacer 118. The inner spacer 118 may be comprised of any insulating material, e.g., silicon dioxide, silicon oxynitride, etc. The inner spacers 118 may be formed by depositing a conformal layer of insulating material that over-fills the inner spacer cavities. At that point, an anisotropic etching process may be performed to remove excess amounts of the insulating material positioned outside of the inner spacer cavities.

Figure 12:
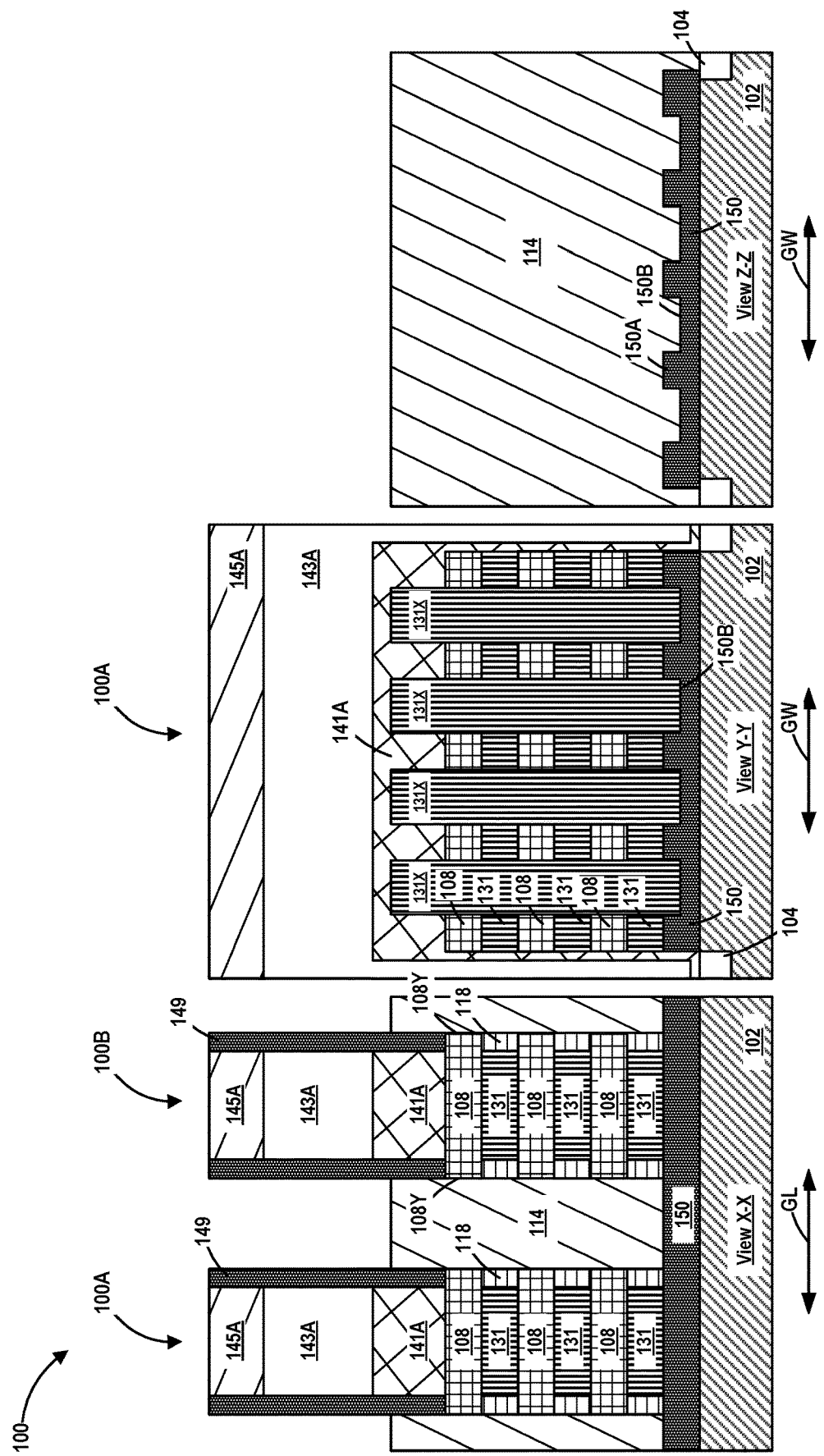

FIG. 12 depicts the nanowire transistor devices 100 after the formation of regions of epitaxial semiconductor material 114 in the source/drain regions of the nanowire transistor devices 100. As shown in FIG. 12, the regions of source/drain epitaxial semiconductor material 114 are conductively coupled to the end surfaces 108Y of the nanowire structures 108 as the end surfaces 108Y of the nanowire structures 108 served as growth surfaces for the epitaxial semiconductor material 114. In the depicted example, the regions of source/drain epitaxial semiconductor material 114 physically contact the upper surface of the lower isolation structure 150. The regions of source/drain epitaxial semiconductor material 114 may be formed by performing traditional epitaxial semiconductor growth processes. The source/drain epitaxial semiconductor material 114 may be comprised of a variety of different materials and different source/drain epitaxial semiconductor materials 114 may be formed on different type devices, e.g., silicon (Si), silicon germanium (SiGe), etc., for P-type devices, silicon, silicon-carbide (SiC), etc., for N-type devices. In other applications, the source/drain epitaxial semiconductor material 114 may be the same material for both types of devices, e.g., silicon for both the N- and P-type devices. In one illustrative process flow, the regions of epitaxial semiconductor material 114 may be doped with a particular type of dopant (N or P) as it is grown, i.e., it may be doped in situ. In other applications, the epitaxial semiconductor material 114 may be initially formed as substantially un-doped epi material and thereafter doped with the appropriate dopant atoms by performing one or more ion implantation processes. In even other applications, even if the epitaxial semiconductor material 114 is initially doped in situ, additional dopant material may be added to the epitaxial semiconductor material 114 by way of ion implantation. The quantity or volume of the epitaxial semiconductor material 114 that is formed for a particular transistor device 100 may vary depending upon the particular application.

Figure 13:
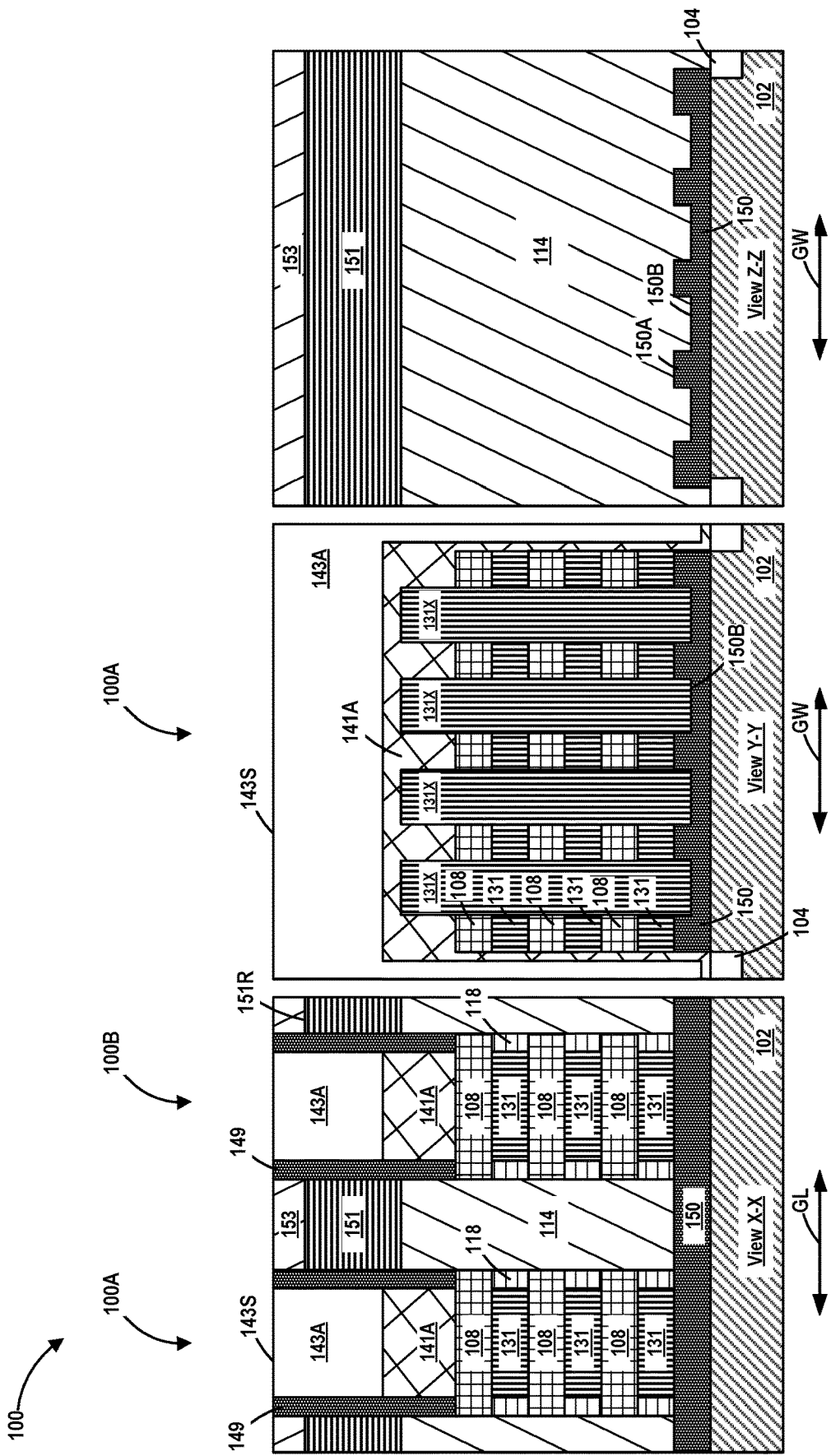

FIG. 13 depicts the nanowire transistor devices 100 after several process operations were performed. First, a layer of insulating material 151, e.g., silicon dioxide, was formed in the spaces between adjacent spacers 149 and above the epitaxial semiconductor material 114. The layer of insulating material 151 may be initially formed so as to over-fill the spaces between adjacent spacers 149. Thereafter, a planarization or CMP process operation was performed to planarize the upper surface of the insulating material 151. At that point, a recess etching process was performed on the layer of insulating material 151 such that it has a recessed upper surface 151R that is positioned at a level that is below a level of the upper surface 143S of the sacrificial gate electrode 143A of the sacrificial gate structures of the nanowire transistor devices 100. The amount of recessing of the layer of insulating material 151 may vary depending upon the particular application. Next, a layer of capping material 153, e.g., silicon nitride, was formed so as to over-fill the space above the recessed layer of insulating material 151 and above the gate caps 145A (see FIG. 12). At that point, one or more CMP process operations were performed to remove the gate cap 145A of the gate structures and thereby expose the upper surface 143S of the sacrificial gate electrode 143A of the sacrificial gate structure of the each of the devices 100. This process operation also results in the formation of a protective cap layer 153 above the portions of the recessed layer of insulating material 151 positioned between the spacers 149.

Figure 14:
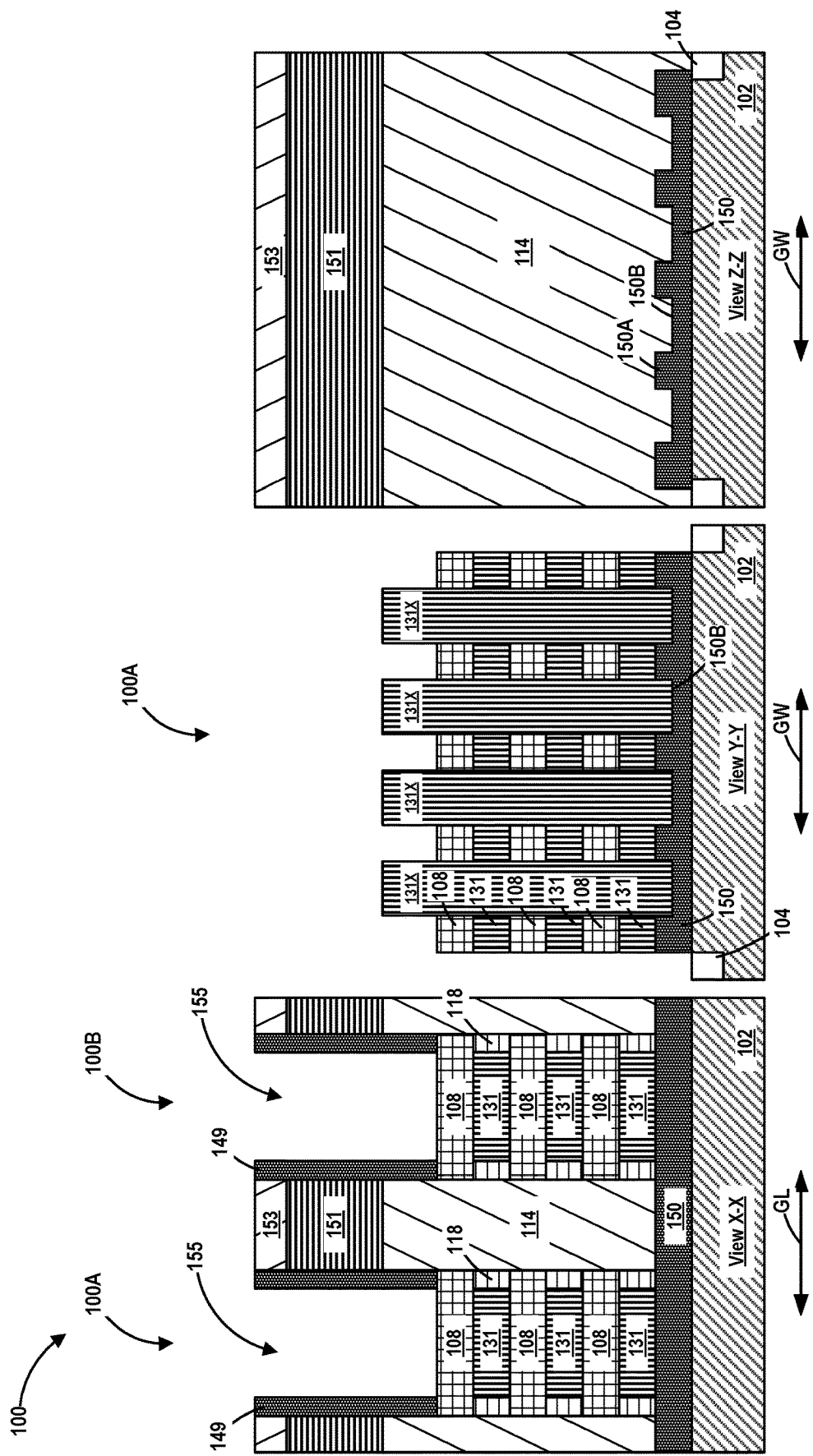

FIG. 14 depicts the nanowire transistor devices 100 after several process operations were performed to remove the sacrificial gate structure (i.e., the sacrificial gate insulation layer 141A and the sacrificial gate electrode structure 143B) of each of the transistor devices 100. These process operations result in the formation of a replacement gate cavity 155 for each of the nanowire transistor devices 100.

Figure 15:
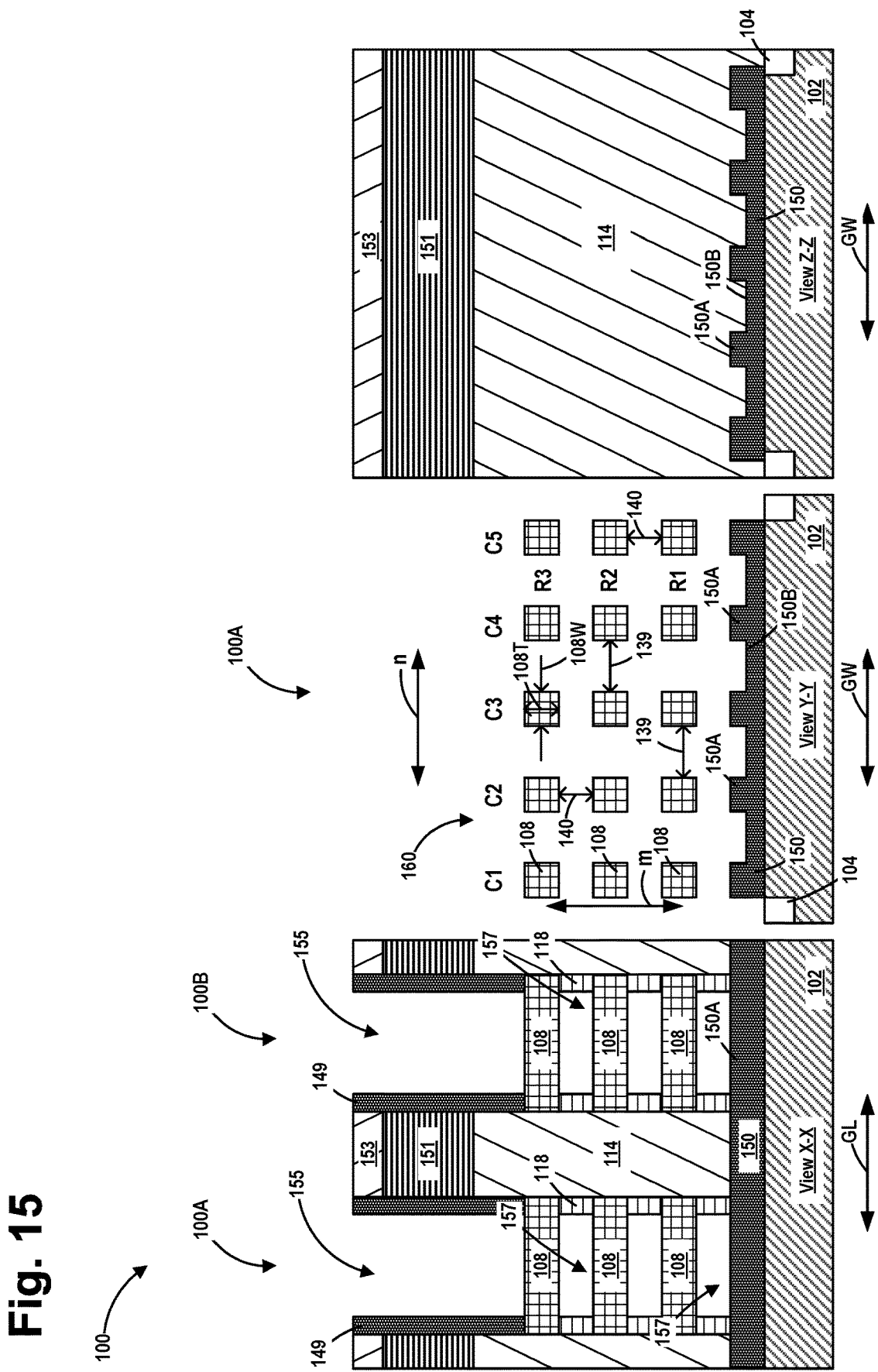

FIG. 15 depicts the nanowire transistor devices 100 at a point in time after one or more etching processes, e.g., isotropic etching processes, were performed so as to selectively remove the layers of the second sacrificial semiconductor material 131 and the additional second sacrificial semiconductor material 131X relative to the surrounding materials. This process operation exposes the plurality of nanowire structures 108 that are positioned under the gate cavity 155 of each of the devices and above the lower isolation structure 150 and results in the formation of a cavity 157 between each of the nanowire structures 108 and the inner spacers 118.

The arrangement of nanowire structures 108 shown in FIG. 15 constitute a matrix 160 of nanowire structures 108 that, in the depicted example, comprises fifteen of the nanowire structures 108. In the example shown in FIG. 15, the matrix 160 of nanowire structures 108 are arranged in five substantially vertically oriented columns (C1-C5) and three substantially horizontally oriented rows (R1-R3). Of course, the number of the nanowire structures 108 in the matrix 160, the number of columns in the matrix 160 and the number of rows in the matrix 160 may vary depending upon the particular application. In general, the matrix 160 of nanowire structures 108 has a general "m"×"n" configuration, wherein "m" represents the number of substantially horizontally oriented rows of the nanowire structures 108 and wherein "n" represents the number of substantially vertically oriented columns of the nanowire structures 108. Thus, in the illustrative example shown in FIG. 15, the matrix 160 of nanowire structures 108 is a 3×5 matrix 160. It should also be noted that the direction "n" corresponds to a length direction of the matrix 160, wherein the length direction of the matrix 160 is the same as the gate width (GW) direction of the nanowire transistor devices 100. Additionally, the direction "m" corresponds to a height direction of the matrix 160, wherein the height direction of the matrix 160 is substantially normal to an upper surface of the substrate 102. With reference to the view Y-Y, it should also be noted that each of the columns (C1-C5) of nanowire structures 108 is positioned substantially vertically above a portion of the axial length (in the gate length direction) of a ridge 150A of the lower isolation structure 150.

With continued reference to the illustrative example depicted in FIG. 15, the nanowire structures 108 are depicted as having a substantially (and simplistically depicted) square cross-sectional configuration when viewed in a cross-section (see view Y-Y) taken through the nanowire structures 108 in a direction corresponding to the gate width (GW) direction of the nanowire transistor devices 100. Of course, as will be appreciated by those skilled in the art after a complete reading of the present application, the cross-sectional configuration of the nanowire structures 108 in the matrix 160 may vary depending upon a variety of factors. For example, in some embodiments, the nanowire structures 108 may have a substantially rectangular shaped cross-sectional configuration, a substantially circular shaped cross-sectional configuration or a substantially oval shaped cross-sectional configuration as compared to the substantially square shaped cross-sectional configuration shown in FIG. 15.

The physical size of the nanowire structures 108 in the gate width direction as well as the vertical direction shown in FIG. 15 may vary depending upon the particular application. In one illustrative embodiment, where the nanowire structures 108 have a substantially square configuration, the nanowire structures 108 may have a lateral width 108W and a vertical height 108T that are approximately the same. Of course, the absolute magnitude of the lateral width 108W and the vertical height 108T may vary depending upon the particular application. In one illustrative embodiment, based upon current-day technology, the lateral width 108W may be about 5-50 nm and the vertical height 108T may be about 5-15 nm. Similarly, in one illustrative embodiment, the lateral spacing 139 (in the gate width direction) between the columns (C1-C5) of the nanowire structures 108 as well as the vertical spacing 140 between the rows (R1-R3) of the nanowire structures 108 may vary depending upon the particular application. In one particularly illustrative example, the lateral spacing 139 and the vertical spacing 140 may be substantially equal, e.g., about 12-16 nm, although that situation is not reflected in the drawings. In other embodiments, the lateral spacing 139 and the vertical spacing 140 may be different from one another. In general, based upon current-day technology, the lateral spacing 139 may be about 15-25 nm and the vertical spacing 140 may be about 10-20 nm.

Figure 16:
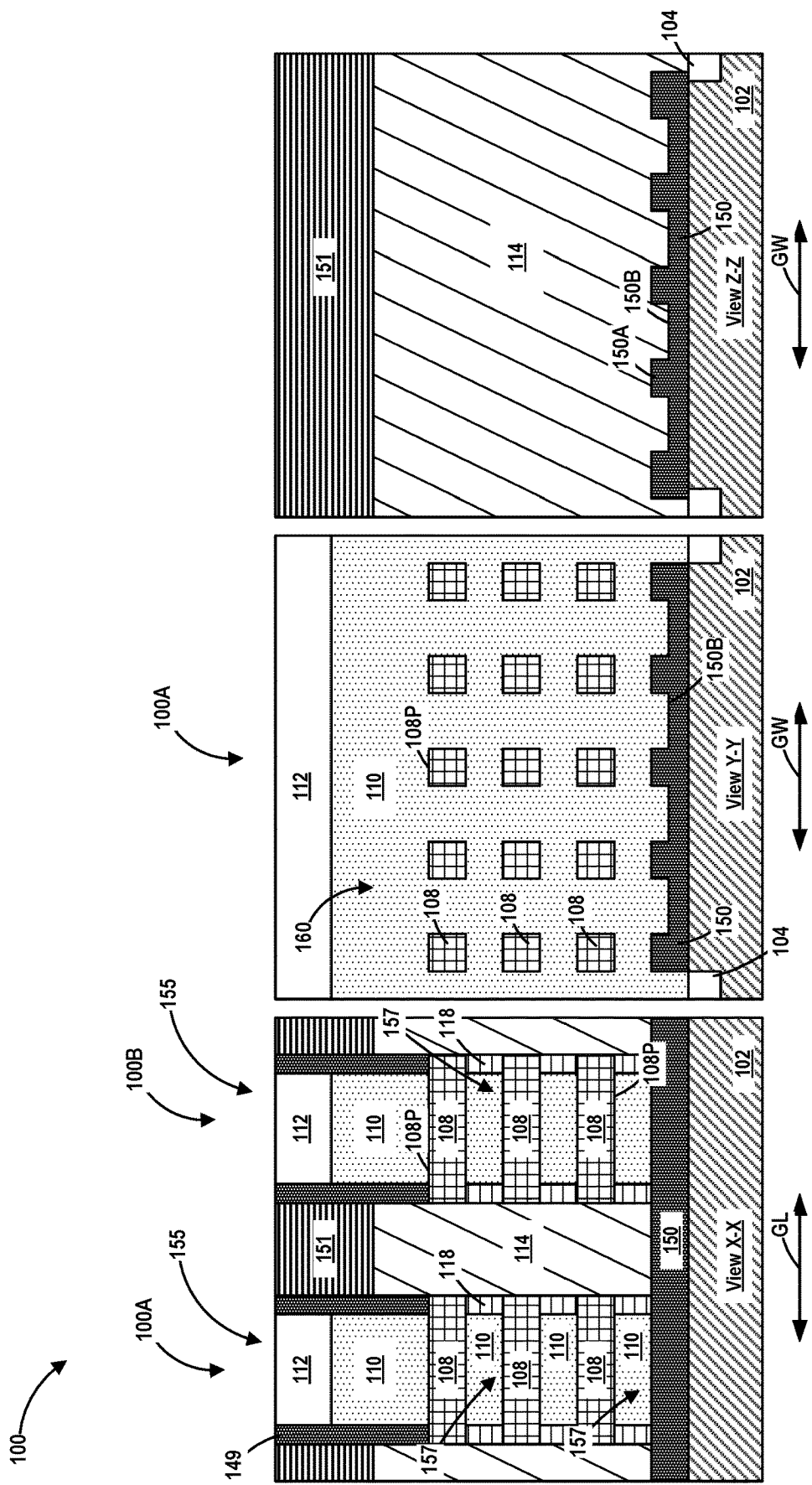

FIG. 16 depicts the nanowire transistor devices 100 after several process operations were performed. First, a simplistically depicted final replacement gate structure 110 was formed in the gate cavities 155 and a final gate cap 112 was formed above the replacement gate structure 110 within each of the gate cavities 155. In one illustrative embodiment, each of the final replacement gate structures 110 comprises a high-k (k value of 10 or greater) gate insulation layer (not separately shown) and various conductive materials (not separately shown) i.e., one or more metal layers and/or polysilicon, that function as the gate electrode of the final replacement gate structure 110. After the materials of the final replacement gate structure 110 were formed in the gate cavities 155 and above the upper surface of the cap layer 151, one or more CMP process operations were then performed to remove excess portions of the materials of the final replacement gate structure 110 positioned outside the replacement gate cavities 155. Thereafter, a timed, recess etching process was performed to recess the materials of the final replacement gate structure 110 so as to thereby make room for the gate cap 112 to be formed in the replacement gate cavities 155 above the recessed materials of the final replacement gate structure 110. The gate cap 112 was formed by depositing a layer of gate cap material, e.g., a dielectric material such as, for example, silicon nitride, across the substrate and in the gate cavities 155 above the recessed materials of the final replacement gate structure 110 and thereafter performing a CMP process to remove the excess gate cap material. Importantly, the final replacement gate structure 110 (including the final gate insulation layer and the final gate electrode structure) surrounds the outer perimeter 108P of the portion of each of the plurality of nanowire structures 108 in the matrix 160 that are positioned below the final gate structure 110. Thus, for example, with respect to the embodiment shown in FIG. 16, the final gate structure 110 of the nanowire transistor device 100A surrounds the outer perimeter 108P of the portion of each of the fifteen individual nanowires structures 108 that are positioned below the final gate structure 110. That is, the final gate structure 110 of a nanowire transistor device 100 disclosed herein, e.g., the transistor device 100A, surrounds the outer perimeter 108P of all of the nanowire structures 108 in the matrix 160 of that particular transistor device.

Figure 17:
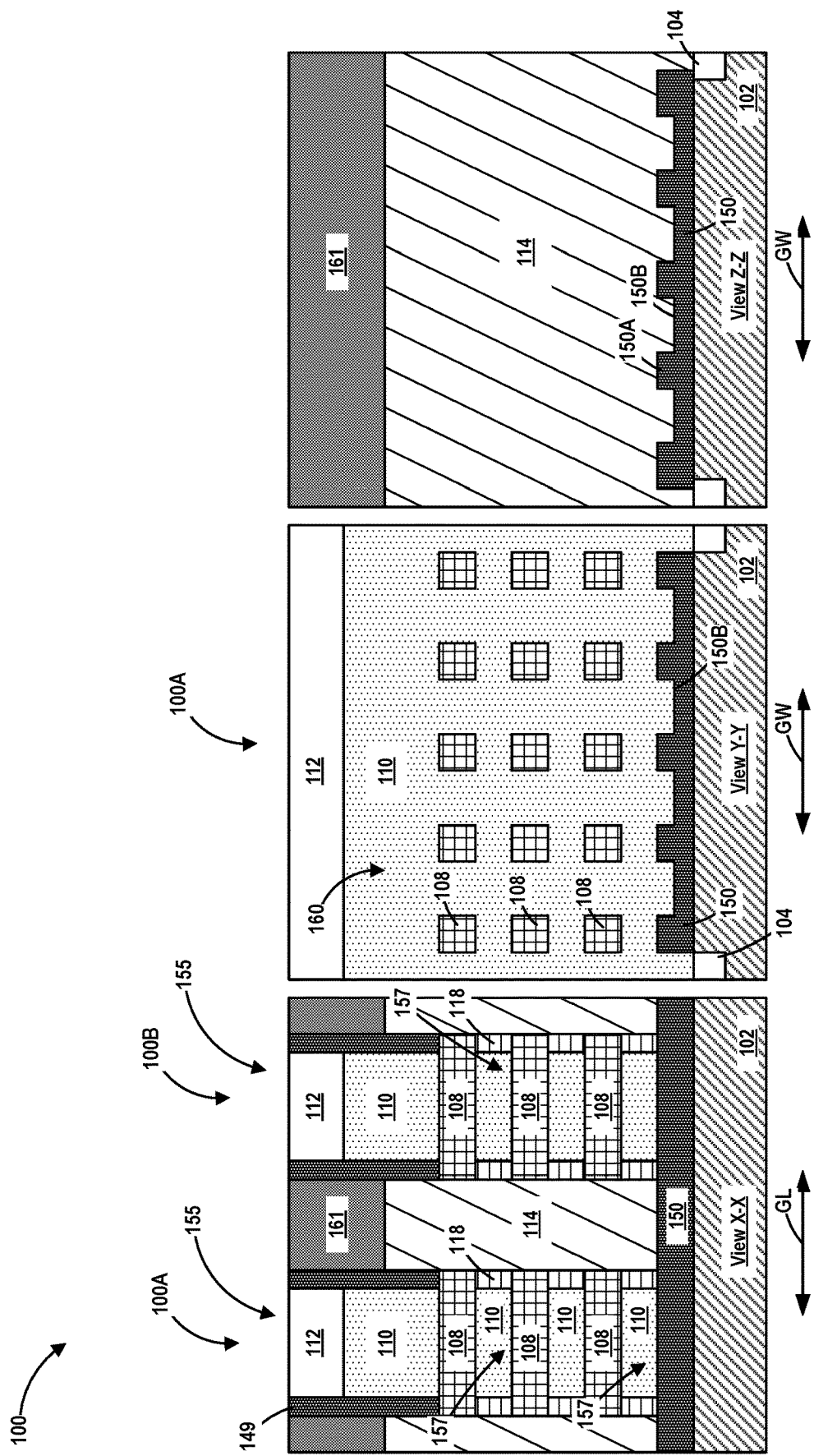

FIG. 17 depicts the nanowire transistor devices 100 after the cap layer 151 was etched selectively relative to surrounding materials and after illustrative source/drain contact structures 161 were formed so as to conductively contact the epitaxial semiconductor material 114 in the source/drain regions of the nanowire transistor devices 100. The source/drain contact structures 161 may be formed by performing traditional manufacturing techniques and they may be comprised of a variety of different conductive materials, e.g., tungsten. In some embodiments, the source/drain contact structures 161 may also include a metal silicide material (not separately shown), e.g., a trench silicide. In the depicted example, the source/drain contact structures 161 are line-type structures that span across both source/drain regions (in the gate width direction of the devices 100 (see views X-X and Z-Z). In other cases, the source/drain contact structures 161 may be individual point-type contacts having a generally cylindrical or rectangular configuration (when viewed from above). Note that the lower isolation structure 150 extends across the entire active area of the nanowire transistor devices 100, i.e., under the epitaxial semiconductor material 114 in the source/drain regions and under the final gate structures 110 (and the nanowire structures 108). With respect to the extension of the gate structure 110 in the gate width (GW) direction, the lower isolation structure 150 will be positioned under substantially the entire dimension of the gate structure 110 in the gate width direction. Note that the lower isolation structure 150 extends across substantially the entire active area of the transistor devices 100, i.e., the lower isolation structure 150 is positioned above the upper surface 102S of the substrate and below the gate structure 110 and below the epi material 114 formed in the source/drain regions of the device.

Figure 18:
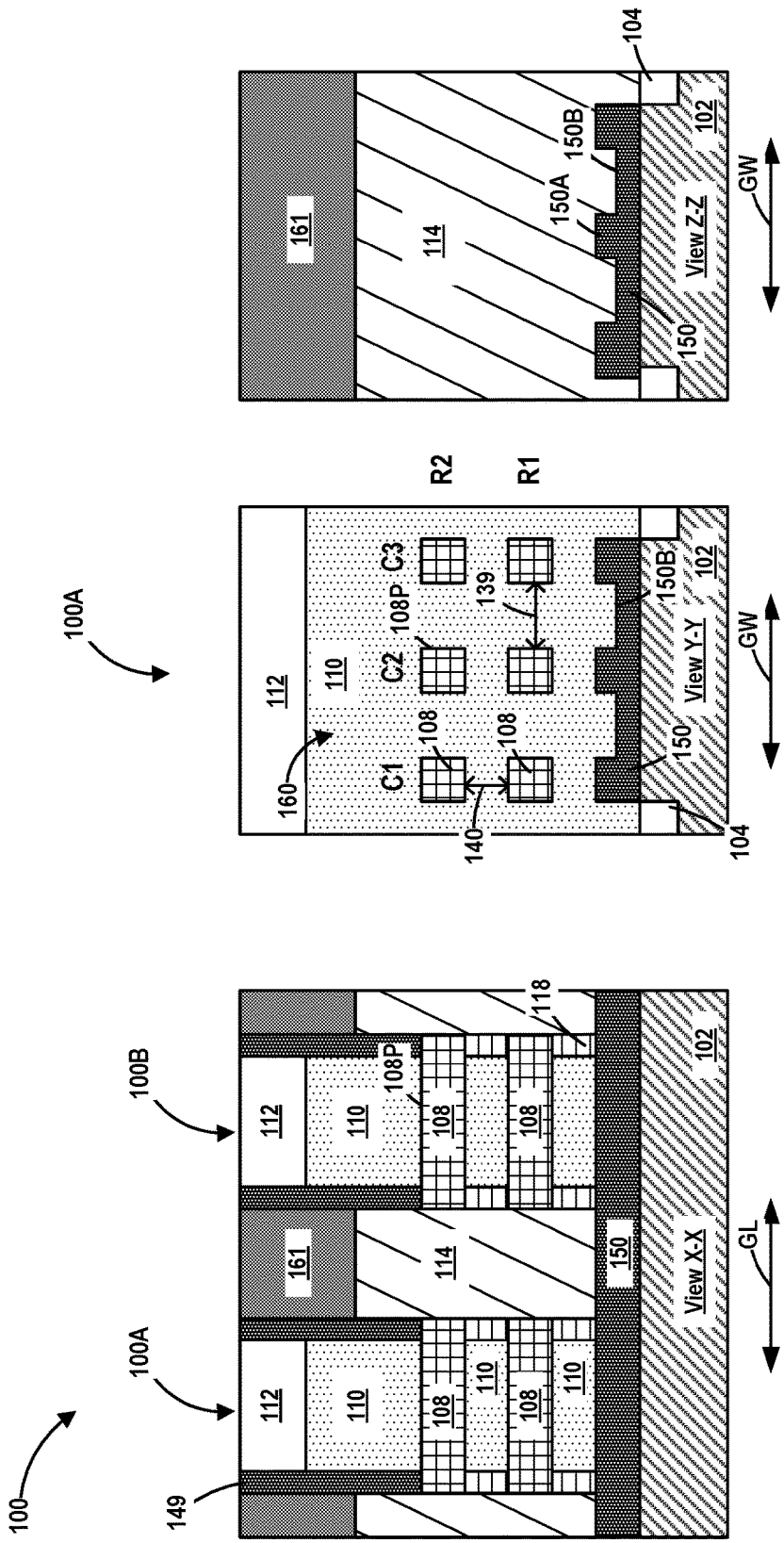
FIG. 18 depicts another illustrative embodiment of a transistor disclosed herein that includes a matrix of nanowires.

FIG. 18 depicts another illustrative embodiment of a nanowire transistor device 100 disclosed herein that includes another embodiment of a matrix 160 of nanowire structures 108. As noted above, the number of the nanowire structures 108 in the matrix 160, the number of columns in the matrix 160 and the number of rows in the matrix 160 may vary depending upon the particular application. FIG. 18 depicts an embodiment of a nanowire transistor device 100 wherein the matrix 160 of nanowire structures 108 comprises six nanowire structures 108 that are arranged in three substantially vertically oriented columns (C1-C3) and two substantially horizontally oriented rows (R1-R2). Thus, in the illustrative example shown in FIG. 18, the matrix 160 of nanowire structures 108 is a 2×3 matrix 160. As before, in the example shown in FIG. 18, the nanowire structures 108 have a substantially square configuration and they have a lateral width (in the gate width direction) and a vertical height that are approximately the same. Additionally, in the example shown in FIG. 18, the lateral spacing 139 (in the gate width direction) between the columns (C1-C3) of the nanowire structures 108 is greater than the vertical spacing 140 between the rows (R1-R2). However, as noted above, the physical size of the nanowire structures 108 and the physical spacing between the columns (C1-C3) and rows (R1-R2) may vary depending upon the particular application. As before, the final gate structure 110 of the nanowire transistor device 100A shown in FIG. 18 surrounds the outer perimeter 108P of the portion of each of the six individual nanowires structures 108 that are positioned below the final gate structure 110. As before, the final gate structure 110 of the nanowire transistor device 100 shown in FIG. 18 surrounds the outer perimeter 108P of all of the nanowire structures 108 in the matrix 160 of that particular transistor device.

Figure 19:
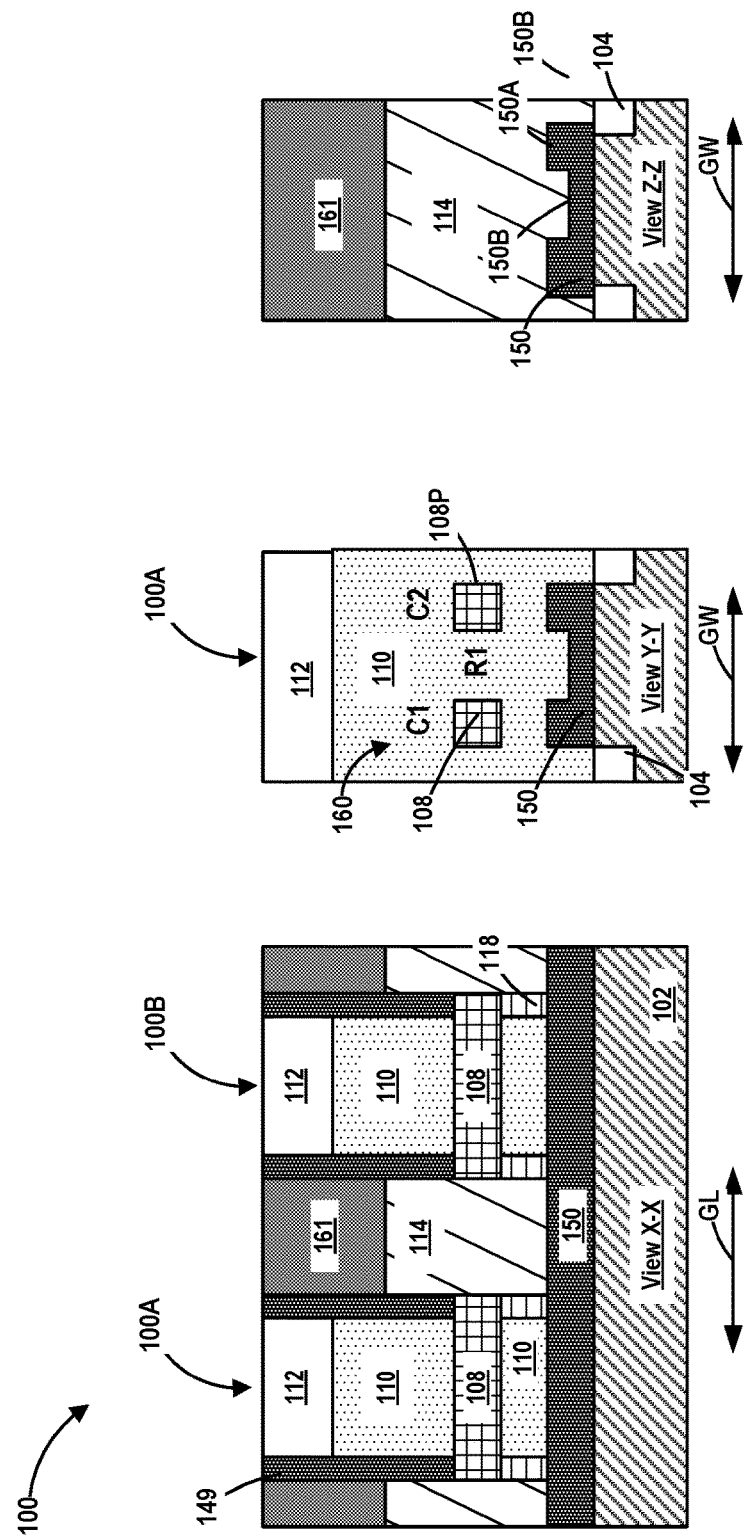
FIG. 19 depicts yet another illustrative embodiment of a transistor disclosed herein that includes a matrix of nanowires.

FIG. 19 depicts yet another illustrative embodiment of a nanowire transistor device 100 disclosed herein that includes another embodiment of a matrix 160 of nanowire structures 108. This embodiment depicts the minimum number of nanowire structures 108—two—for a matrix 160 of nanowire structures 108 disclosed herein. More specifically, FIG. 19 depicts an embodiment of a nanowire transistor device 100 wherein the matrix 160 of nanowire structures 108 comprises two nanowire structures 108 that are arranged in two substantially vertically oriented columns (C1-C2) and one horizontally oriented row (R1). Thus, in the illustrative example shown in FIG. 19, the matrix 160 of nanowire structures 108 is a 1×2 matrix 160. Similar to the embodiment shown in FIG. 18, in the example shown in FIG. 19, the nanowire structures 108 have a substantially square configuration and they have a lateral width (in the gate width direction) and a vertical height that are approximately the same. As before, the final gate structure 110 of the nanowire transistor device 100 shown in FIG. 19 surrounds the outer perimeter 108P of all of the nanowire structures 108 in the matrix 160 of that particular transistor device.

FIGS. 20-23 depict another illustrative embodiment of an inserted-oxide nanowire transistor device 100 disclosed herein that includes a matrix 160 of nanowire structures 108 and various novel methods of making such a transistor. In this example, the matrix 160 of nanowire structures 108 comprises nine nanowire structures 108 that are arranged in three substantially vertically oriented columns (C1-C3) and three substantially horizontally oriented rows (R1-R3). Thus, the matrix 160 of nanowires 108 is a 3×3 matrix. In this embodiment, the lateral spacing 139 between the substantially vertically oriented columns (C1-C3) is greater than the vertical spacing 140 between the substantially horizontally oriented rows (R1-R3). The amount by which the lateral spacing 139 exceeds the vertical spacing 140 may vary depending upon the particular application, e.g., 5-20 nm. In terms of absolute numbers, based upon current-day technology, in one illustrative embodiment, the lateral spacing 139 may be about 15 nm and the vertical spacing 140 may be about 10 nm. The lateral spacing 139 may be established by the formation of an appropriate patterned etch mask 139 (see FIG. 2) that is used when patterning the layers of semiconductor materials, 108 and 131. As in the other examples, in the example shown in FIGS. 20-23, the nanowire structures 108 have a substantially square configuration and they have a lateral width (in the gate width direction) and a vertical height that are approximately the same.

Figure 20:
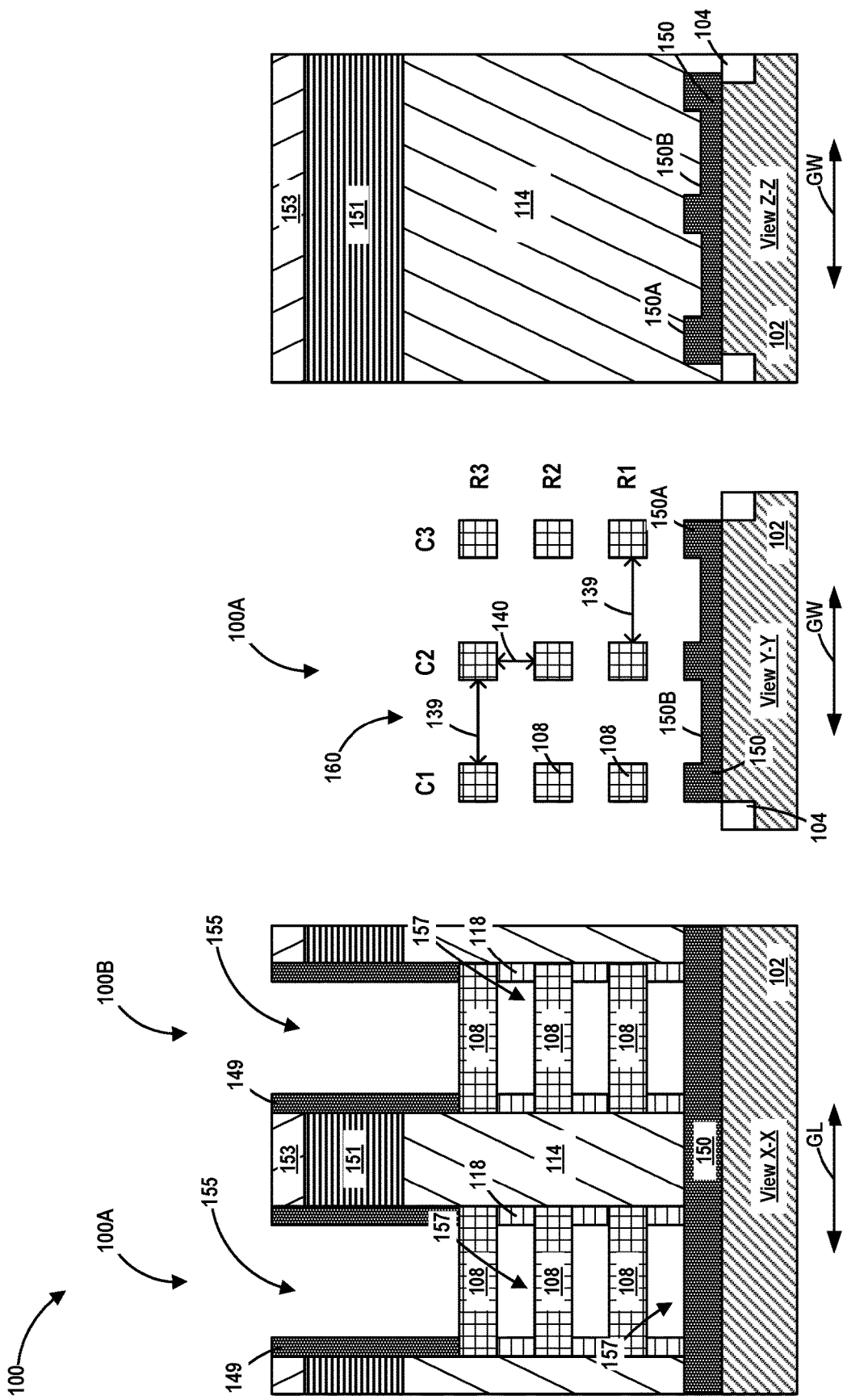
FIGS. 20-23 depict another illustrative embodiment of a transistor disclosed herein that includes a matrix of nanowires and various novel methods of making such a transistor.

FIG. 20 depicts the inserted-oxide nanowire transistor devices 100 at a point in processing that corresponds to the point of processing depicted in FIG. 15 above, i.e., after the removal of the sacrificial gate structures so as to form a replacement gate cavity 155 for each of the inserted-oxide nanowire transistor devices 100 shown in FIG. 20 and after one or more etching processes were performed so as to selectively remove the layers of the second sacrificial semiconductor material 131 and the additional second sacrificial semiconductor material 131X relative to the surrounding materials.

Figure 21:
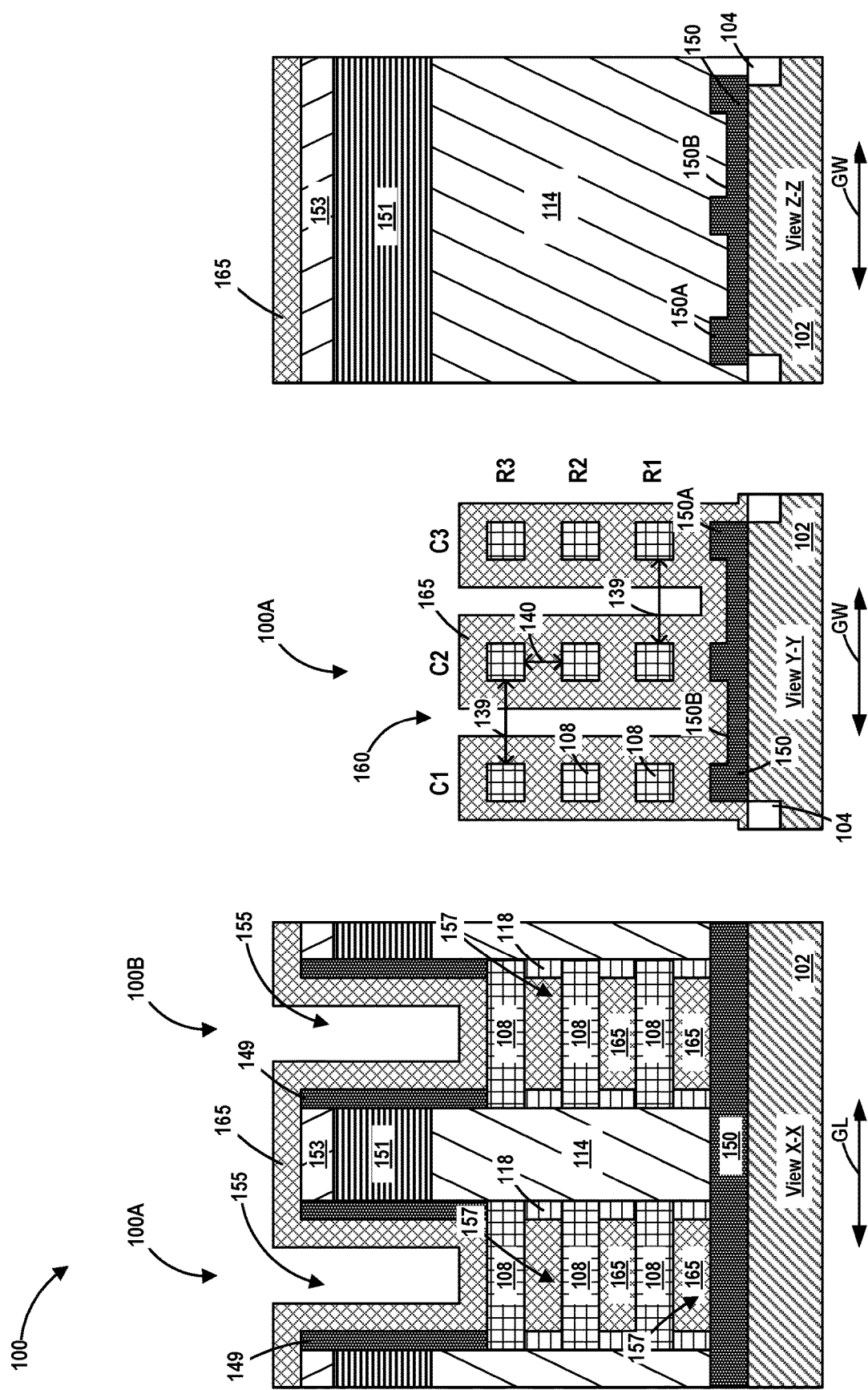

FIG. 21 depicts the devices 100 after a conformal deposition process was performed to form a layer of insulating material 165 (e.g., silicon dioxide) on the product. This layer of insulating material 165 over-fills the cavities 157 between the nanowire structures 108. However, since the distance 139 between the columns C1-C3 is greater than the distance 140 between the rows R1-R3, the layer of insulating material does not pinch-off in the spaces between the columns C1-C3. The thickness of the layer of insulating material 165 may vary depending upon the particular application. In general, the layer of insulating material 165 should be made of a material that exhibits good etch selectivity relative to the material used for the lower isolation structure 150.

Figure 22:
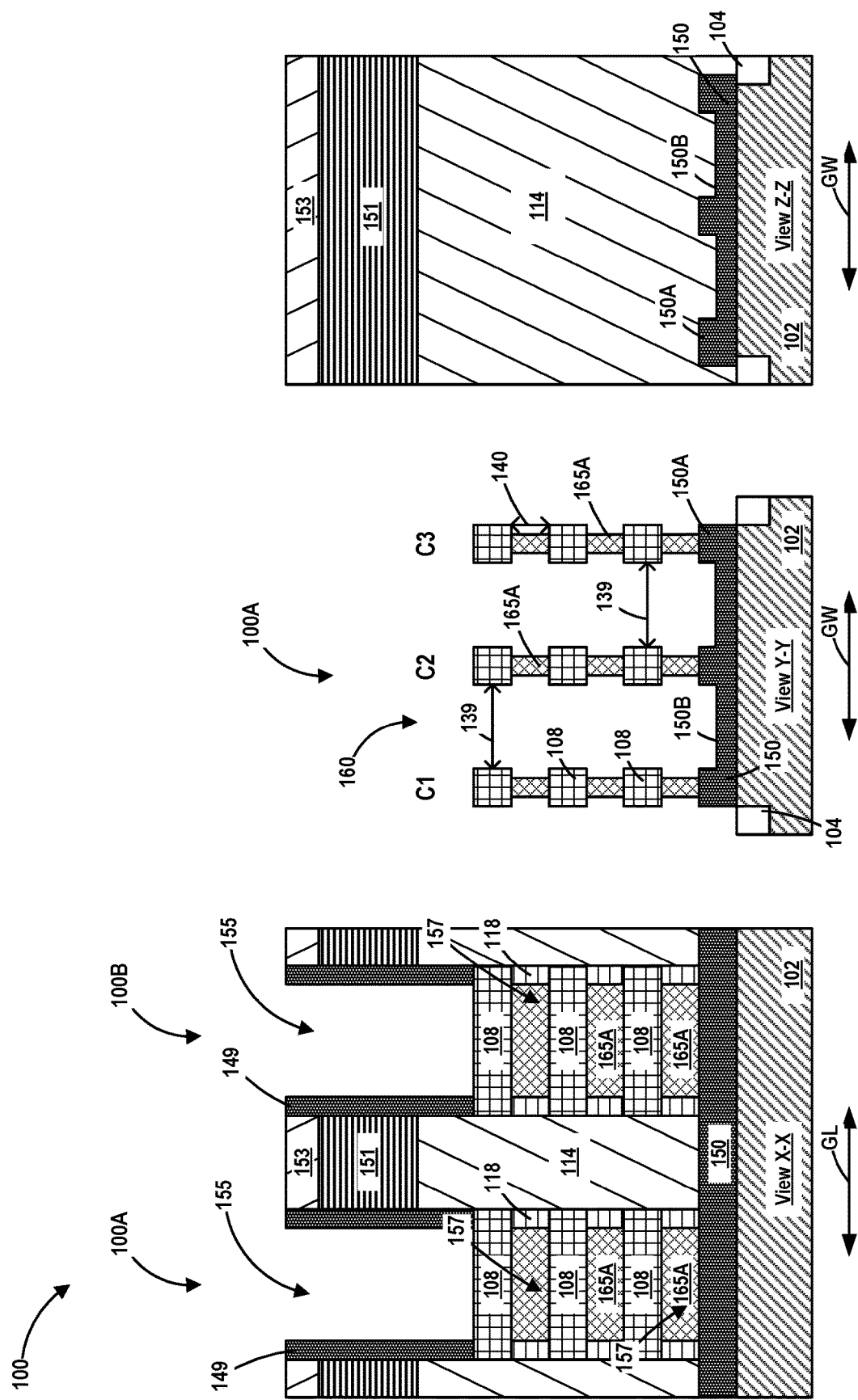

FIG. 22 depicts the devices 100 after a timed isotropic etching process was performed to selectively remove portions of the layer of insulating material 165 relative to surrounding materials. With reference to the view Y-Y, the etching process was performed in such a manner so as to leave substantially vertically oriented portions 165A of the insulating material 165 positioned between the vertically spaced apart nanowire structures 108 in each of the columns of the nanowire structures 108. This is possible due to the fact that the lateral spacing 139 between the nanowire structures 108 is greater than the vertical spacing 140 between the nanowire structures 108. The lateral thickness (in the gate width direction) of the portions 165A of the insulating material 165 may vary depending upon the particular application and the duration of the isotropic etching process.

Figure 23:
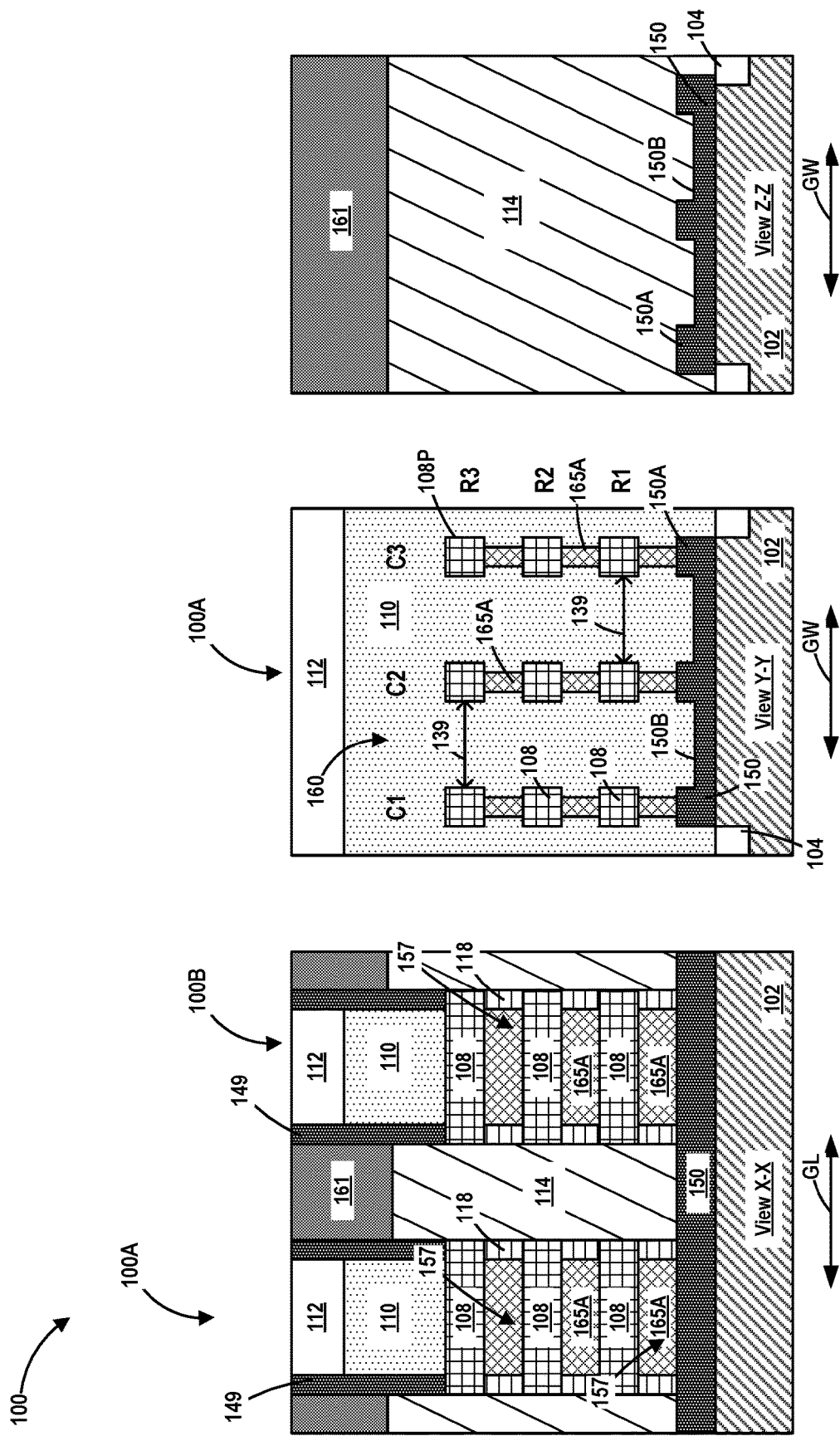

FIG. 23 depicts the inserted-oxide nanowire transistor devices 100 after several of the above-described process operations were performed. First, the above-described final replacement gate structures 110 were formed in the gate cavities 155 and a final gate cap 112 was formed above each of the replacement gate structures 110 within the gate cavities 155. Next, the above-described source/drain contact structures 161 were formed for contacting the source/drain regions of the nanowire transistor devices 100. As before, the final gate structure 110 of the inserted-oxide nanowire transistor device 100 shown in FIG. 23 also surrounds the outer perimeter 108P of all of the nanowire structures 108 in the matrix 160 of that particular transistor device with the exception of the portions of the outer perimeter 108P that are engaged by the portions 165A of the insulating material 165.

FIGS. 24-27 depict yet another illustrative embodiment of an inserted-oxide nanowire transistor device 100 disclosed herein that includes a matrix 160 of nanowire structures 108 and various novel methods of making such a transistor. In this example, as with the previous example, the matrix 160 of nanowire structures 108 comprises nine nanowire structures 108 that are arranged in three substantially vertically oriented columns (C1-C3) and three substantially horizontally oriented rows (R1-R3). Thus, as before, the matrix 160 of nanowire structures 108 is a 3×3 matrix. Unlike the previous example shown in FIGS. 20-23, in this embodiment, the lateral spacing 139 between the substantially vertically oriented columns (C1-C3) is less than the vertical spacing 140 between the substantially horizontally oriented rows (R1-R3). The amount by which the vertical spacing 140 exceeds the lateral spacing 139 may vary depending upon the particular application, e.g., 5-20 nm. In terms of absolute numbers, based upon current-day technology, in one illustrative embodiment, the vertical spacing 140 may be about 20 nm and the lateral spacing 139 may be about 15 nm. The increase in the vertical spacing 140 may be established by increasing the thickness of the layers of the second sacrificial semiconductor material 131 (see FIG. 2). As in the other examples, in the example shown in FIGS. 24-27, the inserted-oxide nanowire structures 108 have a substantially square configuration and they have a lateral width (in the gate width direction) and a vertical height that are approximately the same.

Figure 24:
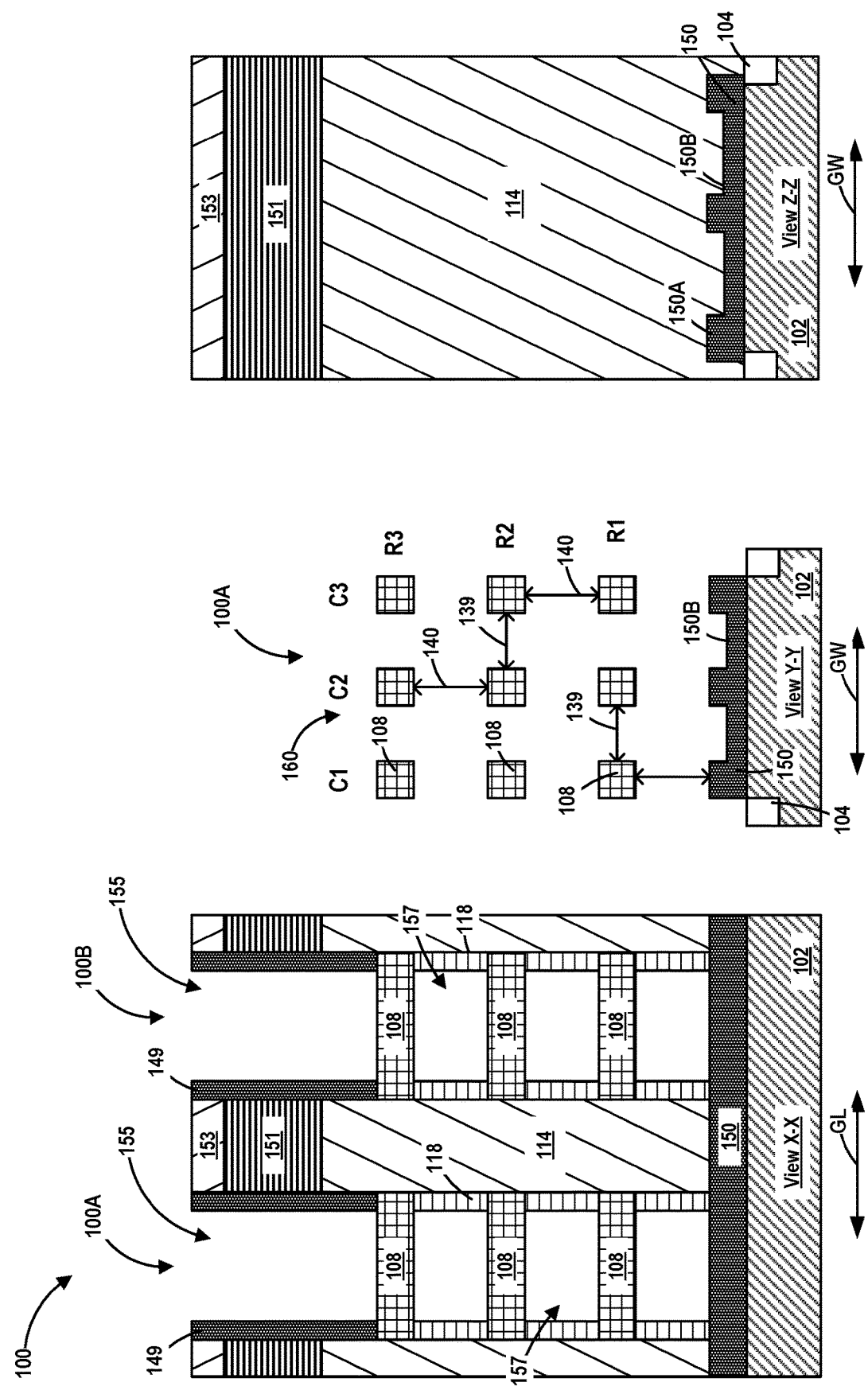

FIG. 24 depicts the inserted-oxide nanowire transistor devices 100 at a point in processing that corresponds to the point of processing depicted in FIG. 15 above, i.e., after the removal of the sacrificial gate structures so as to form a replacement gate cavity 155 for each of the inserted-oxide transistor devices 100 shown in FIG. 24 and after one or more etching processes were performed so as to selectively remove the layers of the second sacrificial semiconductor material 131 and the additional second sacrificial semiconductor material 131X relative to the surrounding materials.

Figure 25:
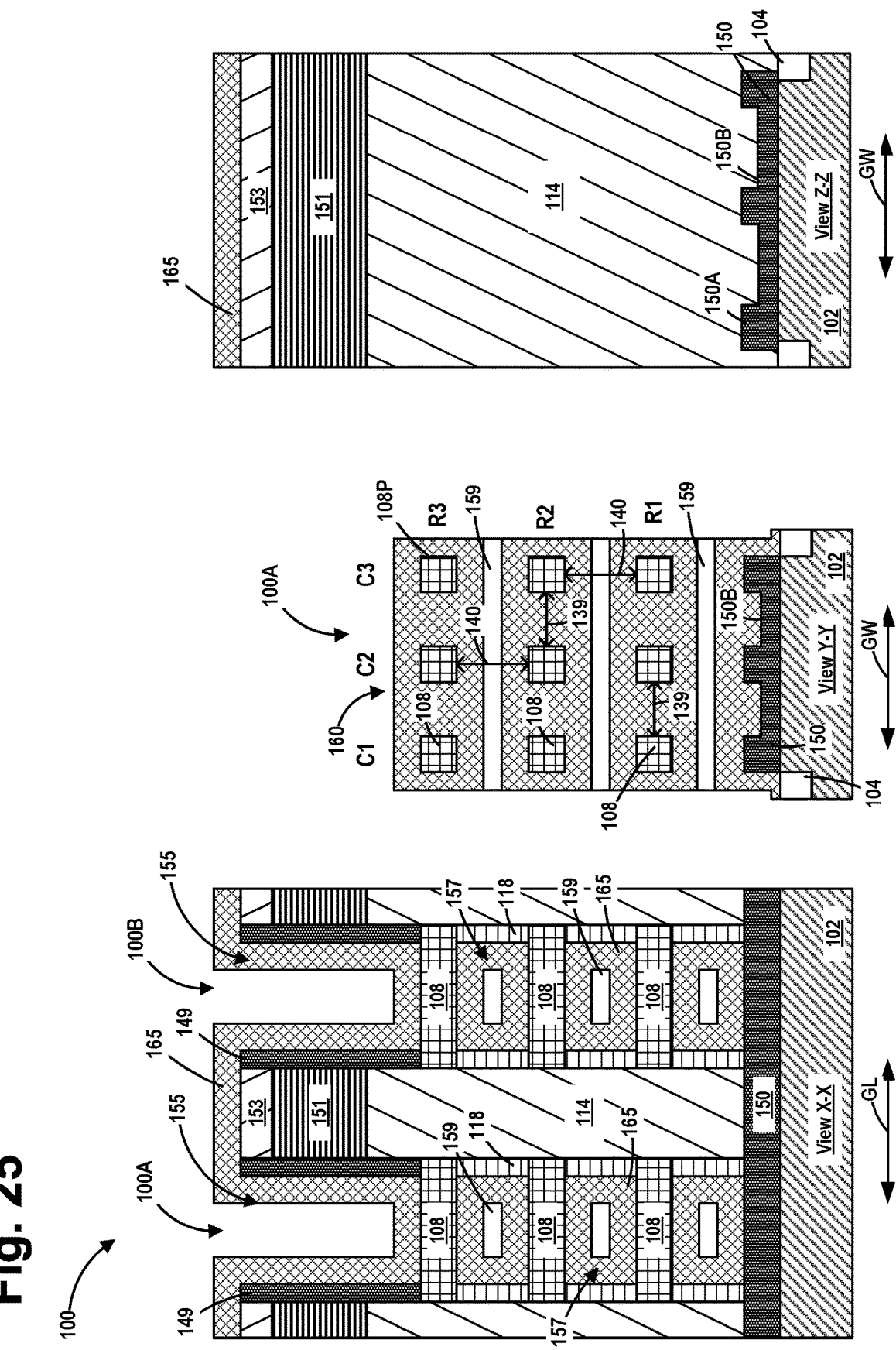

FIG. 25 depicts the devices 100 after the above-described layer of insulating material 165 was formed on the product. In this embodiment, the layer of insulating material 165 over-fills spaces between the columns C1-C3. However, since the distance 139 between the columns C1-C3 is less than the distance 140 between the rows R1-R3, the layer of insulating material 165 does not pinch-off in the spaces between the rows R1-R3 as reflected by the openings or air spaces 159 within the cavities 157. Additionally, as shown in the view X-X, the cavities 157 are not overfilled with the insulating material 165. Rather, the internal surfaces of the cavities 157 are coated with the insulating material 165.

FIG. 26 depicts the inserted-oxide nanowire transistor devices 100 after the above-described timed isotropic etching process was performed to selectively remove portions of the layer of insulating material 165 relative to surrounding materials. With reference to the view Y-Y, the isotropic etching process was performed in such a manner so as to leave substantially horizontally oriented portions 165B of the insulating material 165 positioned between (and engaging) the horizontally spaced apart nanowire structures 108 in each of the rows (R1-R3) of the nanowire structures 108. This is possible due to the fact that the vertical spacing 140 between the rows of nanowire structures 108 is greater than the lateral spacing 139 between the columns of nanowire structures 108. The vertical thickness of the portions 165B of the insulating material 165 may vary depending upon the particular application and the duration of the isotropic etching process.

FIG. 27 depicts the inserted-oxide nanowire transistor devices 100 after several of the above-described process operations were performed to complete the devices 100. First, the above-described final replacement gate structures 110 were formed in the gate cavities 155 and a final gate cap 112 was formed above the replacement gate structure 110 within each of the gate cavities 155. Next, the above-described source/drain contact structures 161 were formed for contacting the source/drain regions of the devices 100. As before, the final gate structure 110 of the inserted-oxide nanowire transistor device 100 shown in FIG. 27 surrounds the outer perimeter 108P of all of the nanowire structures 108 in the 3×3 matrix 160 of that particular transistor device with the exception of the portions of the outer perimeter 108P that are engaged by the portions 165B of the insulating material 165.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A transistor device, comprising:
  a nanowire matrix comprising a plurality of nanowire structures that are arranged in at least one substantially horizontally oriented row and at least two substantially vertically oriented columns, the at least two substantially vertically oriented columns being laterally spaced apart from one another in a gate width direction of the transistor device, each of the plurality of nanowire structures comprising an outer perimeter;
  a gate structure, the gate structure being positioned around the outer perimeter of all of the nanowire structures in the matrix;
  a gate cap positioned above the gate structure;
  a first region of epitaxial semiconductor material positioned in a first source/drain (S/D) region of the transistor device; and
  a second region of epitaxial semiconductor material positioned in a second source/drain (S/D) region of the transistor device, wherein the first and second regions of epitaxial semiconductor material are conductively coupled to each of the plurality of nanowire structures in the nanowire matrix, wherein the transistor device is positioned above an upper surface of a semiconductor substrate and wherein the device further comprises a lower isolation structure positioned above the upper surface of the semiconductor substrate and vertically below at least the gate structure, the first region of epitaxial semiconductor material and the second region of epitaxial semiconductor material.

2. The transistor device of claim 1, wherein the transistor device has a gate length that extends in a gate length direction of the transistor device, wherein each of the nanowire structures has an axial length that extends in the gate length direction and wherein each of the nanowire structures has one of a substantially square cross-sectional configuration, a substantially rectangular cross-sectional configuration, a substantially oval cross-sectional configuration or a substantially circular cross-sectional configuration when viewed in a cross-section taken through the nanowire structure in a direction corresponding to the gate width direction.

3. The transistor device of claim 1, wherein the gate structure comprises a high-k gate insulation layer and a gate electrode comprised of at least one layer of a metal-containing material.

4. The transistor device of claim 1, wherein the at least one substantially horizontally oriented row consists of a single horizontally oriented row of nanowire structures and the at least two substantially vertically oriented columns consists of two substantially vertically oriented columns, wherein each of the substantially vertically oriented columns comprise a single nanowire structure.

5. The transistor device of claim 1, wherein the lower isolation structure comprises an upper surface and a bottom surface, wherein the bottom surface of the lower isolation structure is positioned on and in physical contact with the upper surface of the semiconductor substrate, the first region of epitaxial semiconductor material is positioned on and in physical contact with the upper surface of the lower isolation structure, and the second region of epitaxial semiconductor material is positioned on and in physical contact with the upper surface of the lower isolation structure.

6. The transistor device of claim 1, wherein an upper surface of the lower isolation structure comprises a plurality of ridges and a recess positioned between the plurality of ridges, wherein the plurality of ridges extend in a direction corresponding to the gate length direction of the transistor device, and wherein each of the at least two substantially vertically oriented columns is positioned substantial vertically above one of the plurality of ridges.

7. The transistor device of claim 1, further comprising an insulating material positioned between and engaging the nanowire structures in the at least one substantially horizontally oriented row of nanowires structures.

8. A transistor device, comprising:
  a nanowire matrix comprising a plurality of nanowire structures that are arranged in a plurality of horizontally oriented rows and a plurality of substantially vertically oriented columns, the plurality of substantially horizontally oriented rows being vertically spaced apart from one another, the plurality of substantially vertically oriented columns being laterally spaced apart from one another in a gate width direction of the transistor device, each of the plurality of nanowire structures comprising an outer perimeter;
  a gate structure, the gate structure being positioned around the outer perimeter of all of the nanowire structures in the matrix;
  a gate cap positioned above the gate structure;
  a first region of epitaxial semiconductor material positioned in a first source/drain (S/D) region of the transistor device that conductively contacts the plurality of nanowire structures in the nanowire matrix; and
  a second region of epitaxial semiconductor material positioned in a second source/drain (S/D) region of the transistor device that conductively contacts the plurality of nanowire structures in the nanowire matrix, wherein the transistor device is positioned above an upper surface of a semiconductor substrate and wherein the transistor device further comprises a lower isolation structure positioned above the upper surface of the semiconductor substrate and vertically below at least the gate structure, the first region of epitaxial semiconductor material and the second region of epitaxial semiconductor material.

9. The transistor device of claim 8, wherein the lower isolation structure comprises an upper surface and a bottom surface, wherein the bottom surface of the lower isolation structure is positioned on and in physical contact with the upper surface of the semiconductor substrate, the first region of epitaxial semiconductor material is positioned on and in physical contact with the upper surface of the lower isolation structure, and the second region of epitaxial semiconductor material is positioned on and in physical contact with the upper surface of the lower isolation structure.

10. The transistor device of claim 8, wherein an upper surface of the lower isolation structure comprises a plurality of ridges and a plurality of recesses, with a recess being positioned between adjacent ridges, wherein the plurality of ridges and the plurality of recesses extend in a direction corresponding to a gate length direction of the transistor device, and wherein each of the plurality of substantially vertically oriented columns is positioned substantial vertically above one of the plurality of ridges.

11. The transistor device of claim 8, further comprising an insulating material positioned between and engaging the nanowire structures in each of the plurality of horizontally oriented rows of nanowires structures.

12. The transistor device of claim 8, further comprising an insulating material positioned between and engaging the nanowire structures in each of the plurality of substantially vertically oriented columns of nanowires structures.

13. A transistor device, comprising:
a nanowire matrix comprising a plurality of nanowire structures that are arranged in a plurality of horizontally oriented rows and a plurality of substantially vertically oriented columns, the plurality of substantially horizontally oriented rows being vertically spaced apart from one another, the plurality of substantially vertically oriented columns being laterally spaced apart from one another in a gate width direction of the transistor device, each of the plurality of nanowire structures comprising an outer perimeter;
an insulating material positioned between and engaging the nanowire structures in each of the plurality of horizontally oriented rows of nanowire structures;
a gate structure, the gate structure being positioned around the outer perimeter of all of the nanowire structures in the matrix;
a gate cap positioned above the gate structure;
a first region of epitaxial semiconductor material positioned in a first source/drain (S/D) region of the transistor device that conductively contacts the plurality of nanowire structures in the nanowire matrix; and
a second region of epitaxial semiconductor material positioned in a second source/drain (S/D) region of the transistor device that conductively contacts the plurality of nanowire structures in the nanowire matrix, wherein the transistor device is positioned above an upper surface of a semiconductor substrate and wherein the transistor device further comprises a lower isolation structure positioned above the upper surface of the semiconductor substrate and vertically below at least the gate structure, the first region of epitaxial semiconductor material and the second region of epitaxial semiconductor material.

14. The transistor device of claim 13, wherein the lower isolation structure comprises an upper surface and a bottom surface, wherein the bottom surface of the lower isolation structure is positioned on and in physical contact with the upper surface of the semiconductor substrate, the first region of epitaxial semiconductor material is positioned on and in physical contact with the upper surface of the lower isolation structure, and the second region of epitaxial semiconductor material is positioned on and in physical contact with the upper surface of the lower isolation structure.

15. The transistor device of claim 13, wherein an upper surface of the lower isolation structure comprises a plurality of ridges and a plurality of recesses, with a recess being positioned between adjacent ridges, wherein the plurality of ridges and the plurality of recesses extend in a direction corresponding to a gate length direction of the transistor device, and wherein each of the plurality of substantially vertically oriented columns is positioned substantial vertically above one of the plurality of ridges.

* * * * *